(12) United States Patent
Whetsel

(10) Patent No.: US 7,734,971 B2
(45) Date of Patent: Jun. 8, 2010

(54) SCAN OUTPUT CONNECTION IN TAP AND SCAN TEST PORT

(75) Inventor: Lee D. Whetsel, Parker, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/266,943

(22) Filed: Nov. 7, 2008

(65) Prior Publication Data

US 2009/0132881 A1    May 21, 2009

Related U.S. Application Data

(62) Division of application No. 11/697,150, filed on Apr. 5, 2007, now Pat. No. 7,467,340, which is a division of application No. 11/273,754, filed on Nov. 15, 2005, now Pat. No. 7,219,283, which is a division of application No. 09/845,879, filed on Apr. 30, 2001, now Pat. No. 7,003,707.

(60) Provisional application No. 60/212,417, filed on Jun. 19, 2000, provisional application No. 60/200,418, filed on Apr. 28, 2000.

(51) Int. Cl.
*G01R 31/28* (2006.01)
(52) U.S. Cl. .................. 714/726; 714/724
(58) Field of Classification Search .......... 714/724, 714/726, 727, 733, 734, 30; 716/4
See application file for complete search history.

(56) References Cited

U.S. PATENT DOCUMENTS 6,314,539 B1 * 11/2001 Jacobson et al. ............ 714/727
6,324,614 B1 * 11/2001 Whetsel ...................... 714/726
6,408,414 B1 * 6/2002 Hatada ........................ 714/727
6,804,725 B1 * 10/2004 Whetsel ........................ 710/5
7,310,756 B2 * 12/2007 Whetsel ...................... 714/724
7,467,340 B2 * 12/2008 Whetsel ...................... 714/724
2008/0059855 A1 * 3/2008 Whetsel ...................... 714/727
2009/0217114 A1 * 8/2009 Whetsel ...................... 714/727

* cited by examiner

*Primary Examiner*—Phung M Chung
(74) *Attorney, Agent, or Firm*—Lawrence J. Bassuk; W. James Brady; Frederick J. Telecky, Jr.

(57) ABSTRACT

Two common varieties of test interfaces exist for ICs and/or cores, the IEEE 1149.1 Test Access Port (TAP) interface and internal scan test ports. The TAP serves as a serial communication port for accessing a variety of circuitry including; IEEE 1149.1 boundary scan circuitry, built in self test circuitry, internal scan circuitry, IEEE 1149.4 mixed signal test circuitry, IEEE P5001 in-circuit emulation/debug circuitry, and IEEE P1532 in-system programming circuitry. Internal scan test ports serve as a serial communication port for primarily accessing internal scan circuitry within ICs and cores. Today, the TAP and internal scan test ports are typically viewed as being separate test interfaces, each utilizing different IC pins and/or core terminals. The need for different IC pins and/or core terminals is overcome by an interface in accordance with the disclosure that allows the TAP and internal scan test ports to be merged so they both can co-exist and operate from the same set of IC pins and/or core terminals. Further, this interface allows merged TAP and scan test port interfaces to be selected individually or in groups.

5 Claims, 26 Drawing Sheets

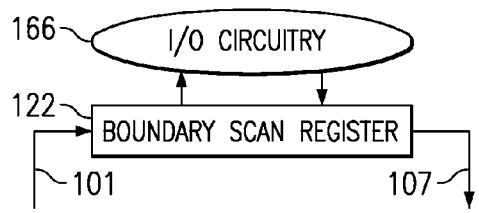
FIG. 1F
(PRIOR ART)
FIG. 1G
(PRIOR ART)
FIG. 2
(PRIOR ART)
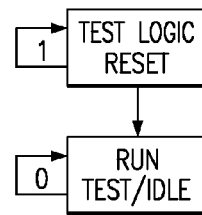
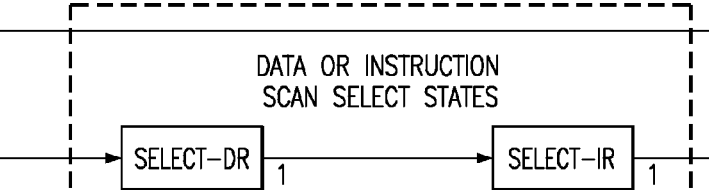
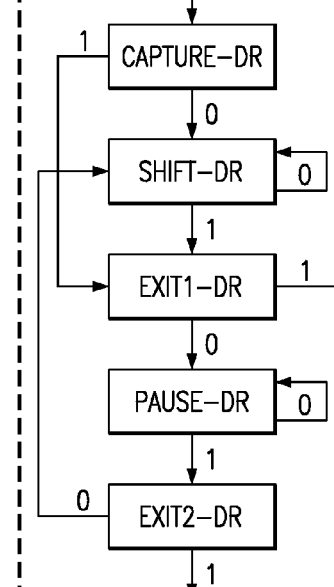
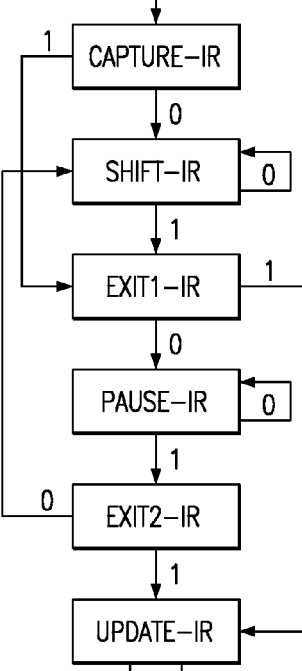

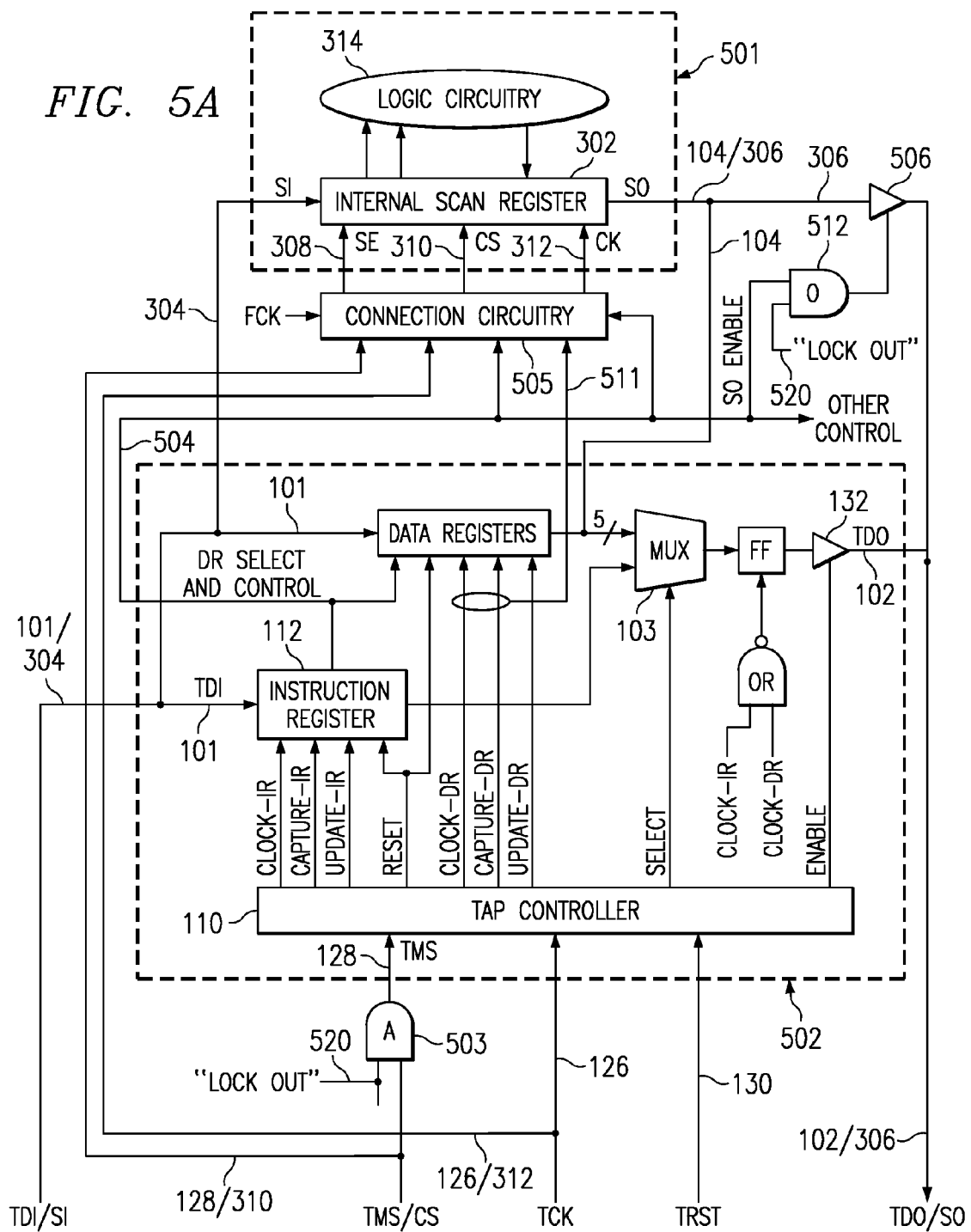

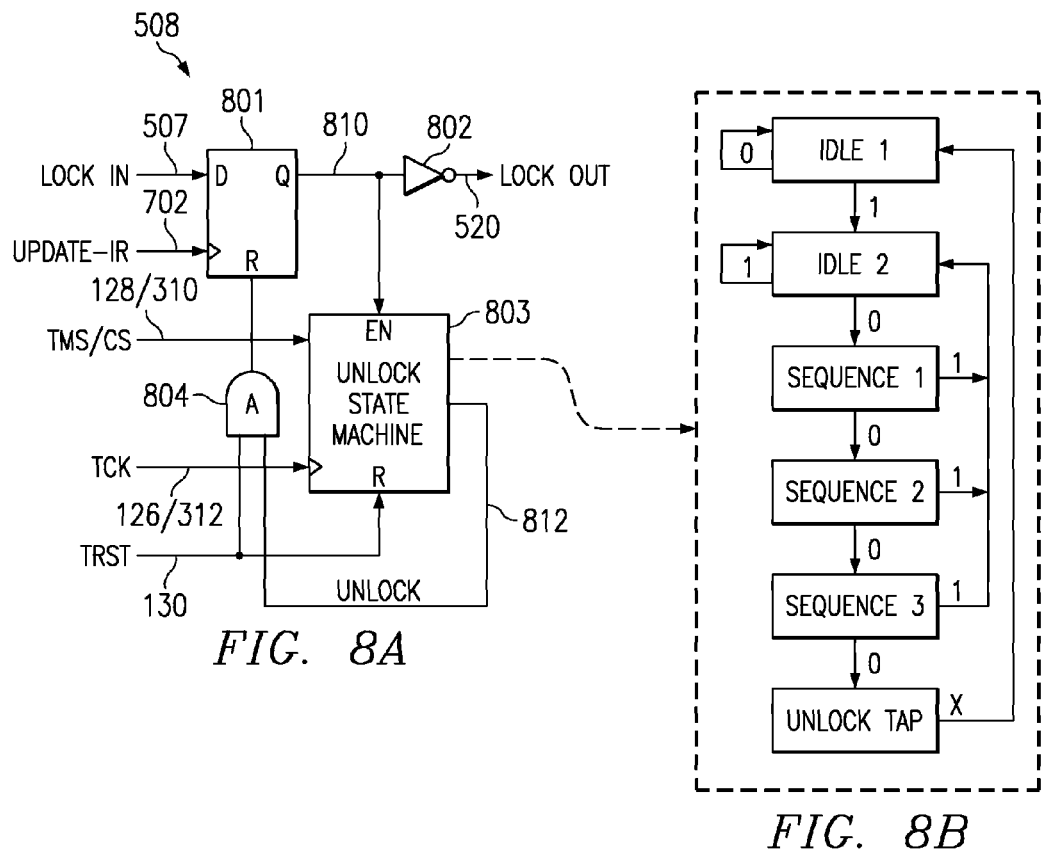
FIG. 8A
FIG. 8B
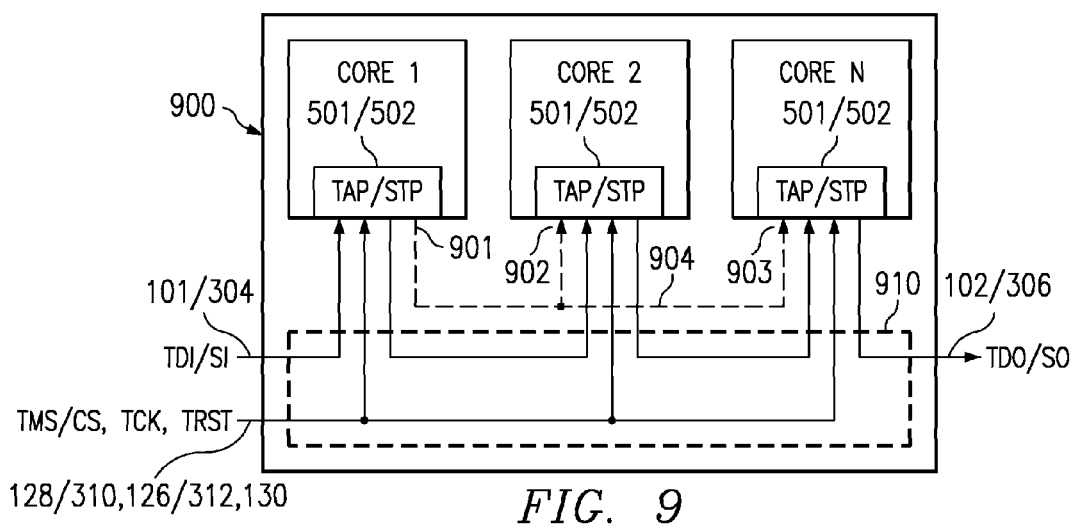
FIG. 9

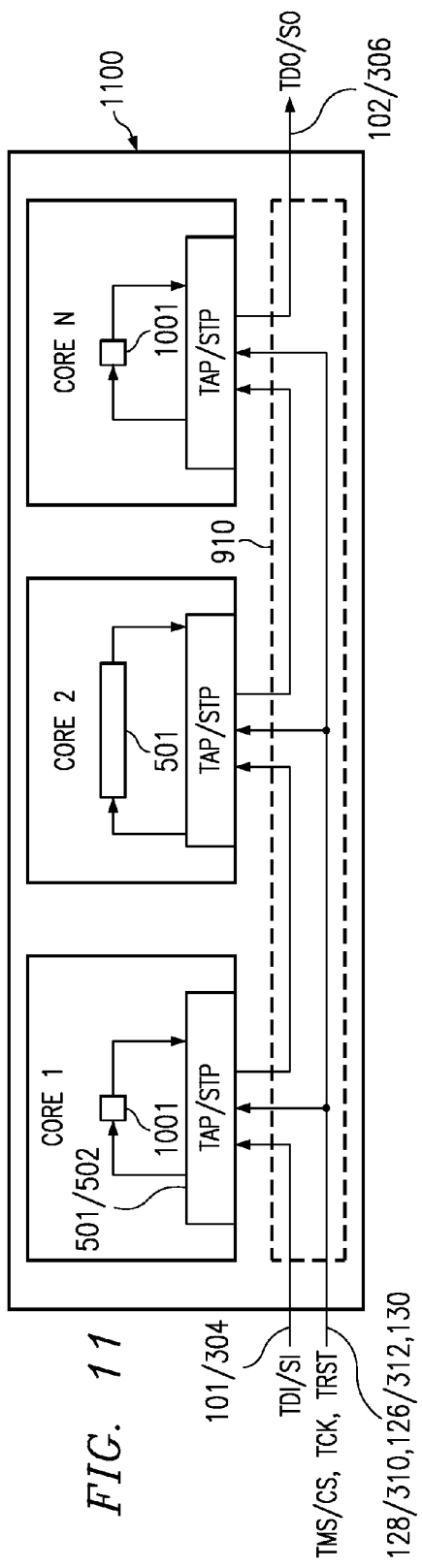
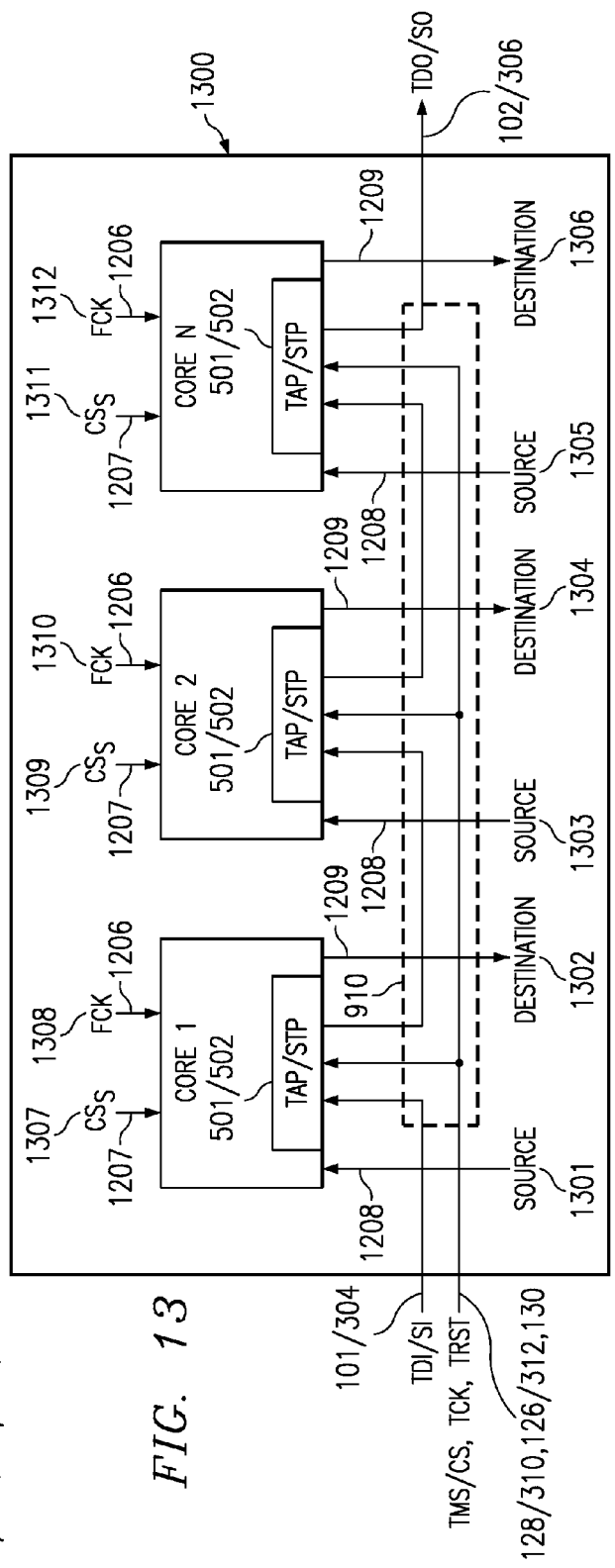
FIG. 11
FIG. 13

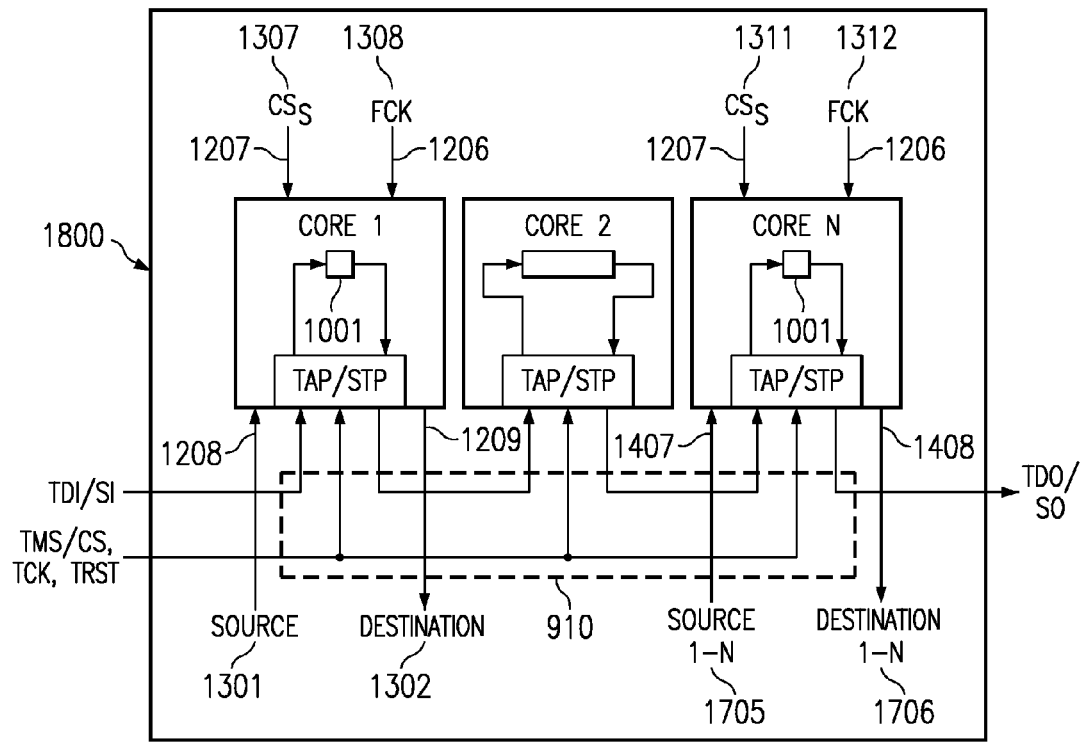
FIG. 18
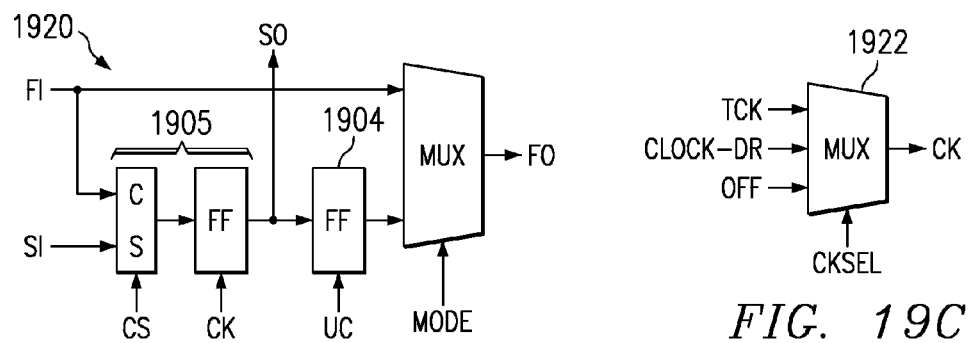
FIG. 19B
FIG. 19C
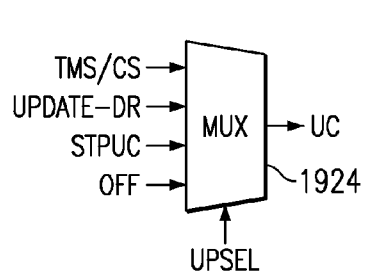
FIG. 19D
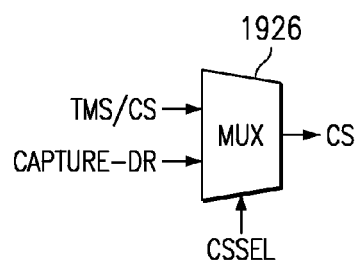
FIG. 19E

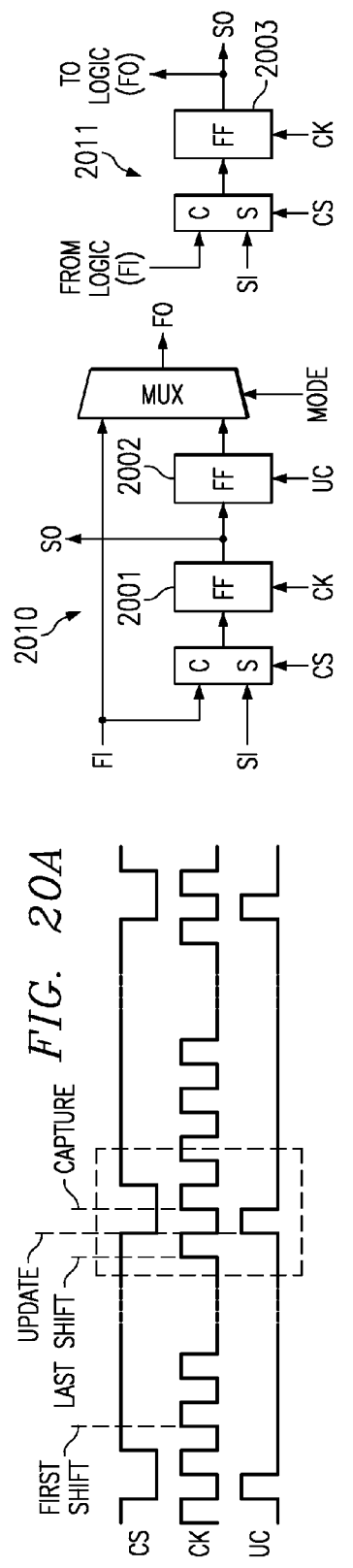
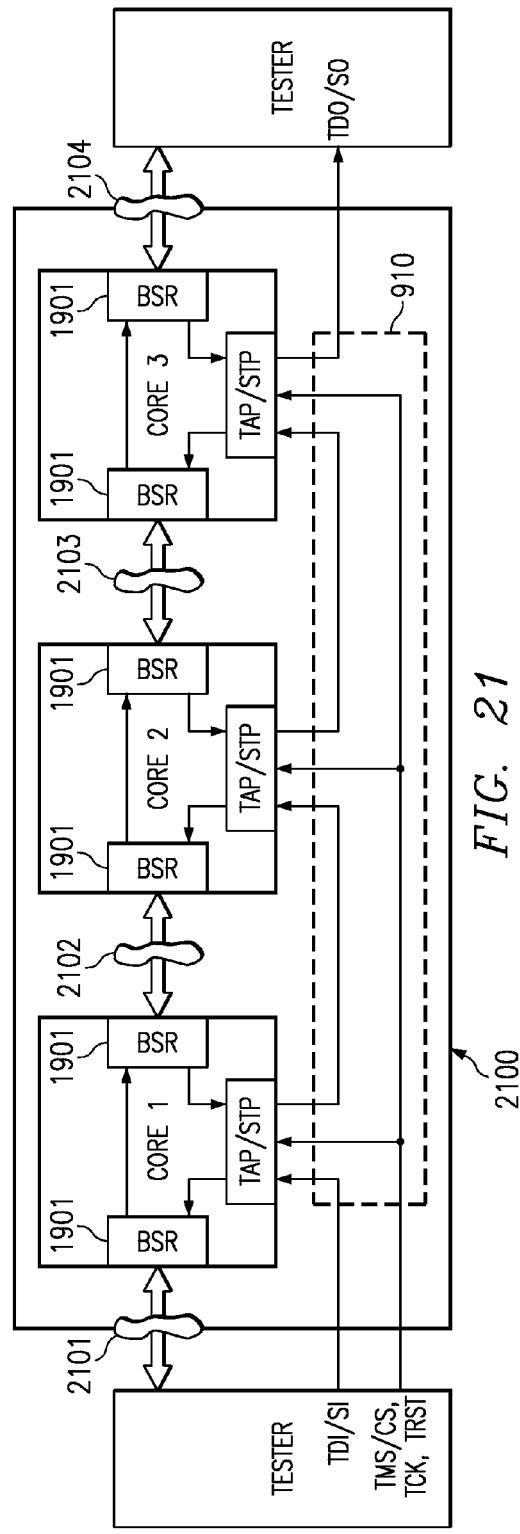

SCAN OUTPUT CONNECTION IN TAP AND SCAN TEST PORT

CROSS REFERENCE TO RELATED APPLICATIONS

This application is a divisional of application Ser. No. 11/697,150, filed Apr. 5, 2007, now U.S. Pat. No. 7,467,340, issued Dec. 16, 2008;

Which was a divisional of application Ser. No. 11/273,754, filed Nov. 15, 2005, now U.S. Pat. No. 7,219,283, issued May 15, 2007; Which was a divisional of application Ser. No. 09/845,879, filed Apr. 30, 2001, now U.S. Pat. No. 7,003,707, issued Feb. 21, 2006; which claims priority under 35 USC 119(e)(1) of provisional application Ser. No. 60/212,417, filed Jun. 19, 2000 and provisional application Ser. No. 60/200,418 filed Apr. 28, 2000.

This application is related to provisional application Ser. No. 60/207,691, filed May 26, 2000, now U.S. Pat. No. 7,058,862, issued Jun. 6, 2006, which is hereby incorporated by reference, and application Ser. No. 09/845,562, filed Apr. 30, 2001, now abandoned.

FIELD OF THE DISCLOSURE

The present disclosure relates generally to integrated circuits and, more particularly, to test interfaces exist for integrated circuits and/or cores

BACKGROUND OF THE DISCLOSURE

FIGS. 1A-G illustrate the test architecture of a conventional 1149.1 TAP. The TAP includes a TAP controller, instruction register, and set of data registers. The set of data registers includes; (1) an internal scan register, (2) an in-circuit emulation (ICE) register, (3) an in-system programming (ISP) register, (4) a boundary scan register, and (5) a bypass register. Of the data registers, the boundary scan register and bypass register are defined by the IEEE 1149.1 standard. The other shown data registers are not defined by 1149.1, but can exist as optional data registers within the data register section of the 1149.1 standard architecture. The TAP controller responds to a protocol input on the TCK and TMS inputs to coordinate serial communication through either the instruction register from TDI 101 to TDO 102, or through a selected one of the data registers from TDI to TDO. The TRST input is used to initialize the TAP to a known state. The operation of the TAP is well known.

FIG. 1B illustrates an IC or intellectual property core circuit incorporating the TAP and its TDI, TDO, TMS, TCK, and TRST interface. A core circuit is a complete circuit function that is embedded within an IC, such as a DSP or CPU. FIGS. 1C-1G illustrate the association between each of the data registers of FIG. 1A and the target circuit they connect to. The data registers are commonly connected at their serial input to TDI 101. The data registers are separately connected at their respective serial outputs 104-108 to associated inputs of multiplexer 103, so that they can be individually selected by an instruction to output data on TDO 102 during a data register scan.

FIG. 2 illustrates the state diagram of the TAP controller of FIG. 1A. The TAP controller is clocked by the TCK input and transitions through the states of FIG. 2 in response to the TMS input. As seen in FIG. 2, the TAP controller state diagram consists of four key state operations, (1) a Reset/RunTest Idle state operation where the TAP controller goes to either enter a reset state, a run test state, or an idle state, (2) a Data or Instruction Scan Select state operation the TAP controller may transition through to select a data register (DR) or instruction register (IR) scan operation, or return to the reset state, (3) a Data Register Scan Protocol state operation where the TAP controller goes when it communicates to a selected data register, and (4) an Instruction Register Scan Protocol state operation where the TAP controller goes when it communicates to the instruction register. The operation of the TAP controller is well known.

FIG. 3A illustrates a conventional internal scan test port interface to an internal scan register. The scan test port includes a scan input (SI), scan output (SO), scan enable (SE), capture select (CS), and clock (CK) inputs. The CK input may be the circuits functional clock or it may be a dedicated test clock input. The SE input is used to place the circuit in a scan test mode. Placing the circuit in a scan test mode may involve conditioning a circuit input for providing the SI input, conditioning a circuit output for providing the SO output, and conditioning a circuit input for the CS input, as indicated by the dashed circles. The SE input may also be used to condition the scan register and logic circuitry such that it operates in a safe mode during the test. For example, it may condition the logic circuit such that no contention occurs between logic outputs during the scan test. In test mode, SI provides the serial input to the internal scan register, SO provides the serial output from the internal scan register, CS provides the control input protocol to cause the internal scan register to capture response data from the logic circuitry then shift data through the scan register from SI to SO to unload the captured response data and load the next stimulus data to be applied to the logic circuitry.

FIG. 3B illustrates an IC or core incorporating the scan test port (STP) of FIG. 3A. For ICs, the SI, SO, and CS signals are typically shared with functional signal pins to save pin count while the SE signal is typically a dedicated IC pin so that it can be accessed to switch the shared pins between their functional and SI, SO, CS test modes. The CK signal may be the ICs functional clock or it may be a dedicated test clock. For cores, the SE, SI, SO, CS, and CK signals may all be dedicated for scan test access since cores typically do not suffer from the pin count problem that ICs do. The role of the SE signal on cores may only be to condition the scan register and logic circuitry for the previously mentioned safe operation during the test, instead of being used to switch inputs and outputs between functional and test mode as mentioned for the IC scan test port SI, SO, and CS signals.

FIG. 3C illustrates an IC or core including both the STP of FIG. 3A and the TAP of FIG. 1A. In FIG. 3C it is seen that the TAP and the STP require different interface signals since their input and output operations are based on different serial interface protocols.

FIG. 4 illustrates a system IC consisting of cores 1-N. Each core includes a TAP interface and a STP interface. The core TAPs are serially connected, via a first scan path wiring bus 410, to allow a tester to access the TAPs of embedded circuits in the cores, such as the embedded target circuits of FIGS. 1C-1F. The STPs are serially connected, via a second scan path wiring bus 420, to allow a tester to access the STPs of embedded internal scan circuitry of the cores, such as the scan circuitry of FIG. 3A. From FIG. 4 it is seen that the system IC requires two test interfaces, one for the core TAPs and another for the core STPs. Further, the IC requires two separate internal scan path wiring buses one scan path wiring bus 410 for the core TAPs and another scan path wiring bus 420 for the core STPs.

BRIEF DESCRIPTION OF THE DRAWINGS

FIGS. 1A-1G illustrate the test architecture of a conventional 1149.1 TAP.

FIG. 2 illustrates the state diagram of the TAP controller of FIG. 1A.

FIG. 5A illustrates the structure of the present disclosure to utilize a single IC test interface and a single internal scan path wiring bus to provide access to the internal scan circuit 501 from either the TAP or STP of FIG. 4.

FIG. 8A illustrates the Lock Out circuit of FIG. 7.

FIG. 8B illustrates the operation of the Unlock state machine of FIG. 8A.

FIG. 9 illustrates an embodiment of a system IC including cores 1-N that use the dual mode TAP/STP interface of the present disclosure.

FIG. 11 illustrates a second embodiment of a system IC including cores 1-N that use the dual mode TAP/STP interface of the present disclosure.

FIG. 13 illustrates a third embodiment of a system IC including cores 1-N that use the dual mode TAP/STP interface of the present disclosure.

FIG. 18 illustrates a sixth embodiment of a system IC including cores 1-N that use the dual mode TAP/STP interface of the present disclosure.

FIG. 19B illustrates a scan cell used in FIG. 19A.

FIGS. 19C-19E illustrate multiplexers used in FIG. 19A.

FIG. 20A illustrates an example timing diagram of STP controlled scan operations to the boundary scan register of FIG. 19A.

FIG. 20B illustrates a circuit for producing the STPUC signal used in FIG. 19D.

FIG. 20C illustrates boundary and internal scan cells.

FIG. 21 illustrates an IC containing cores having and TAP/STP interface coupled to a tester controlled scan path and a boundary scar register.

DETAILED DESCRIPTION OF THE DISCLOSURE

The present disclosure provides a method and structure for merging the core TAPs and STPs into a single test interface and accessing the merged TAP and STP test interface using a single internal scan path wiring bus. Further the present disclosure provides a method and structure for selectively accessing one or more merged TAP and STP test interfaces via a single IC test pin interface and a single IC scan path wiring bus.

Figure 4:
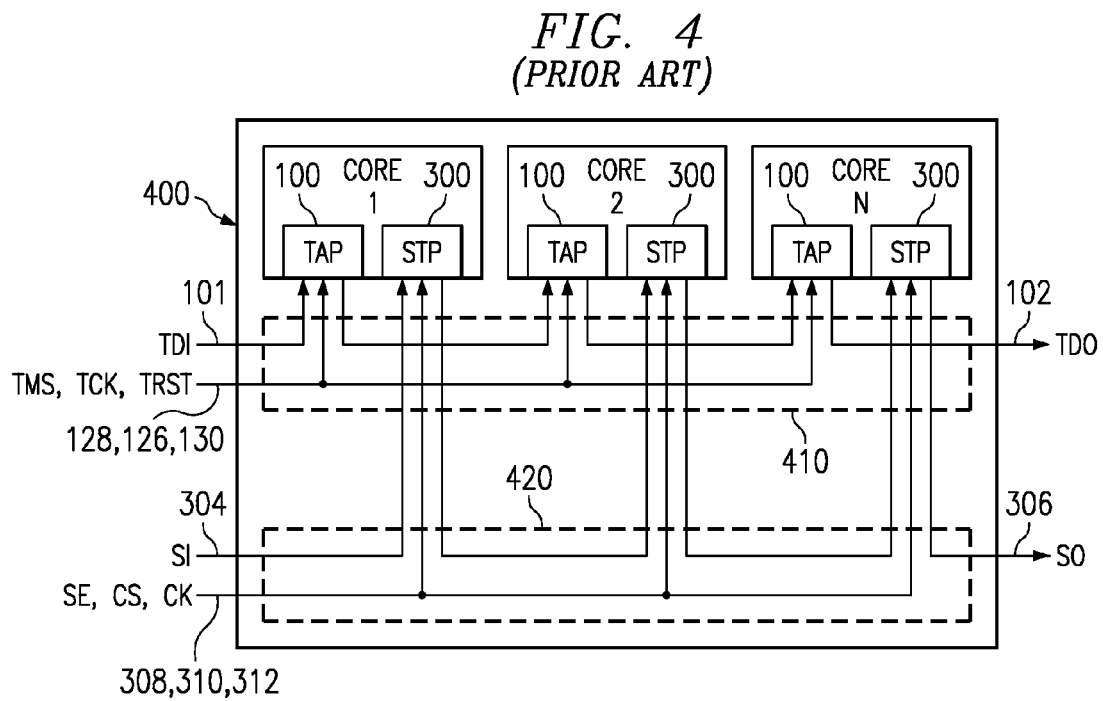
FIG. 4 illustrates a system IC consisting of cores 1-N.

FIG. 5A illustrates the method and structure of the present disclosure to utilize a single IC test interface and a single internal scan path wiring bus to provide access to the internal scan circuit 501 from either the TAP or STP of FIG. 4. In FIG. 5A, the internal scan circuit 501 and TAP circuit 502 share a common SI and TDI test input connection (TDI/SI) and a common SO and TDO test output (TDO/SO) connection. Also the internal scan circuit 501 and TAP circuit 502 share a common TMS and CS test input connection (TMS/CS). Further, the TCK input is shared as a clock for both the internal scan circuit 501 and TAP circuit 502. To enable the sharing of the test interface signals, an AND gate 503 is included in the TMS/CS signal path to the TAP to allow enabling the TAP or disabling the TAP. Also a 3-state buffer 506 is placed on the SO output of the scan circuit 501, and connection circuitry 505 is added as an interface to the scan circuitry. A signal called Lock Out is input to the AND gate 503 and buffer 506 via OR gate 512. OR gate 512 inputs the Lock Out signal and a SO enable signal from the TAP's instruction register via bus 504. When Lock Out is high, the TAP is enabled to receive and respond to the TMS/CS and the output of the 3-state buffer 506 is disabled via OR gate 512. When Lock Out is low, the TAP is disabled from receiving the TMS/CS signal. If the SO enable signal from bus 504 is low, the low on the Lock Out signal also enables the output of the 3-state SO buffer 506, via OR gate 512.

Figure 1A:
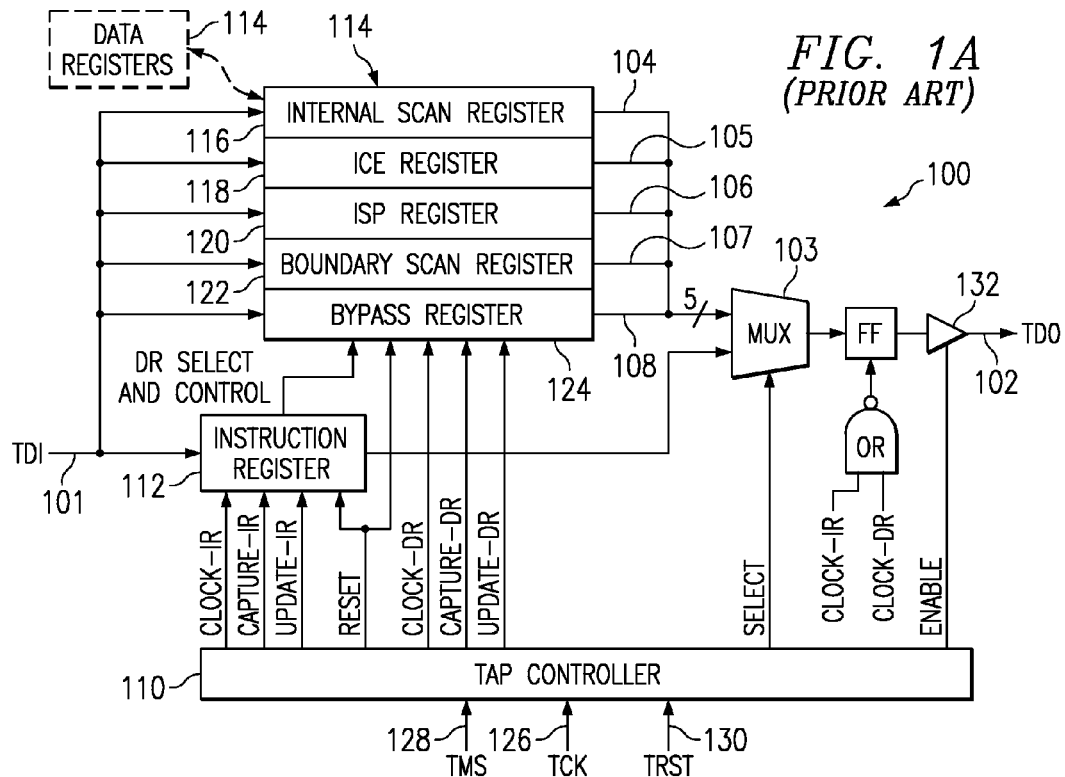
Figure 1B:
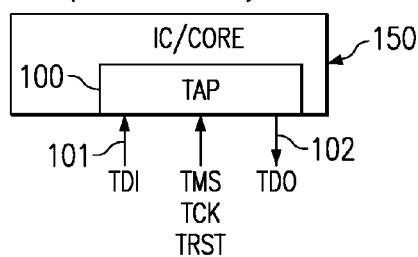
Figure 1C:
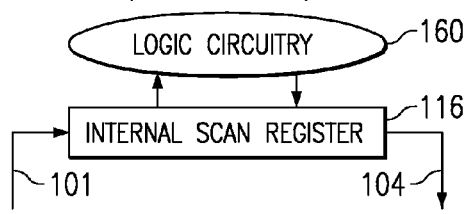

In FIG. 5A, the internal scan register of the internal scan circuit 501 remains a data register within the TAP data registers section, as evidenced by the serial input 101, serial output 104, and control 511 connections to the TAP 502. Therefore, scan circuit 501 remains conventionally accessible as one of the data registers within the TAP's data register section, as previously shown and described in regard to FIGS. 1A and 1C. In general the present disclosure maintains TAP access to any data register which is also rendered accessible by the STP interface, including but not limited to all other data registers shown in FIGS. 1A and 1D-1G. Thus the present disclosure provides a dual mode test access port for accessing data registers using either the TAP or STP interfaces.

Figure 3A:
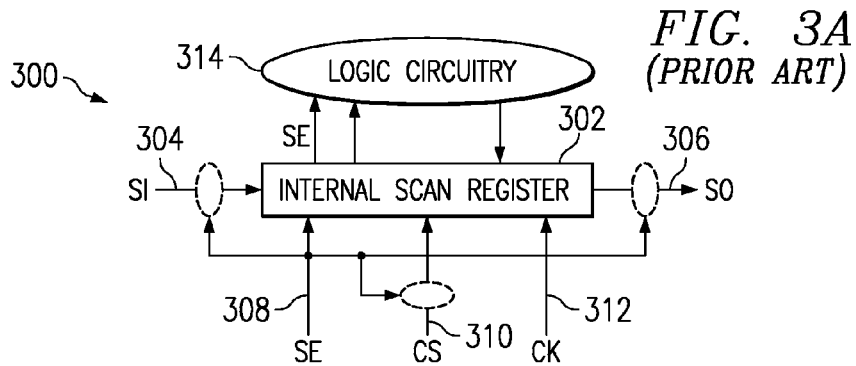
FIG. 3A illustrates a conventional internal scan test port interface to an internal scan register.

Assuming the TAP 502 is initially enabled but that access to the internal scan circuit 501 is desired using the STP interface, the following sequence would occur. The TAP would be accessed to load a scan test instruction into its instruction register. The scan test instruction would be defined according to the present disclosure to output control on bus 504 of the present disclosure to connection circuitry 505 and OR gate 512 of the present disclosure. As seen in FIG. 5A, one of the instruction control output signals that passes through connection circuit 505 to be input to the scan circuit 501 is the SE input. As mentioned in regard to FIG. 3A, the SE input is conventionally input using an IC pin. However, the present disclosure generates the SE signal internally using an instruction which eliminates the need for a dedicated IC pin to input the SE signal. The instruction control on bus 504 may also be output to other circuits not shown in FIG. 5A to condition them for the pending internal scan test operation. The instruction control output occurs during the Update-IR state of FIG. 2. Simultaneous with the instruction control output, the Lock Out signal transitions from a logic high to a logic low. AND gate 503 passes the Lock Out logic low to the TAP's TMS input and OR gate 512 passes the Lock Out logic low to the control input of the SO buffer 506. The TAP controller responds to the logic low on the TMS input to transition from the Update-IR state to the Run Test/Idle state, as seen in FIG. 2. Also the logic low on the Lock Out signal and the logic low on the SO enable signal to OR gate 512 enables the SO buffer 506 to drive the TDO/SO output. Note that if the instruction loaded into the instruction register does not set the SO enable signal to a logic low, the SO output buffer 506 would not be enabled by a the logic low on Lock Out, since the output of OR gate 512 would remain at a logic high state.

Figure 5B:
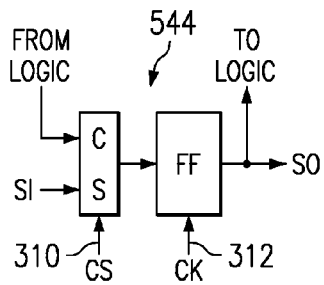
FIG. 5B illustrates an individual scan cell used in FIG. 5A.
Figure 5C:
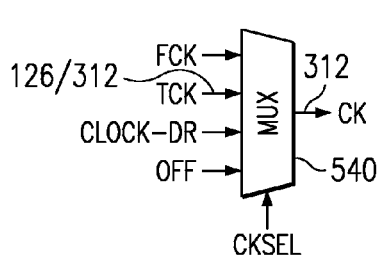
FIGS. 5C and 5D illustrate multiplexers used in FIG. 5A.
Figure 5D:
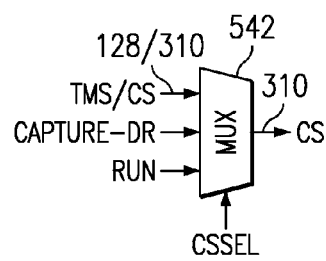

After the above sequence is performed, the TAP is disabled by the Lock Out signal to its Run Test/Idle state (FIG. 2). While the TAP is forced, by the Lock Out signal, to remain in the Run Test/Idle state, the TMS/CS signal can be used as the CS signal of FIG. 3A to control the capture and shift operations of the scan circuit 501. While the TAP is disabled, its TDO output buffer is disabled to allow the enabled SO buffer 506 to drive out on the TDO/SO output. In preparation for an STP controlled scan test, the TCK signal is connected to the scan circuit's CK input using, for example, a multiplexer as shown in FIG. 5C, and the TMS/CS signal is connected to the scan circuit's CS input using, for example, a multiplexer as shown in FIG. 5D. The CKSEL and CSSEL control inputs to the multiplexers of 5C and 5D come from the instruction output control on bus 504. The CK and CS outputs from the multiplexers of 5C and SD are connected to the individual scan cells of the internal scan register of scan circuit 501 as shown in FIG. 5B. The internal scan register comprises multiple ones of the FIG. 5B scan cells connected serially between their serial input (SI) and serial output (SO). The CK and CS multiplexing circuitry reside in connection circuitry 505. The FCK input to connection circuitry 505 is the functional clock source. During the STP controlled scan test operation, scan circuit 501 receives the TMS/CS input as the CS input of FIG. 3A and the TCK input as the CK input of FIG. 3A to capture data and shift data from TDI/SI to TDO/SO of FIG. 5A. Thus, when setup by the sequence described above, the scan circuit 501 is rendered scan testable via the STP interface as described previously in regard to FIG. 3A.

After the above mentioned STP scan test operation is complete, the Lock Out signal returns to a logic high state to disable the SO buffer 506 and to enable the TAP to once again respond to TMS input. When Lock Out goes high, a new instruction may be scanned into the TAP instruction register to place the scan circuit 501 back into its functional operation mode or to start another type of test or other operation.

As seen in FIG. 5C, the CK output maybe connected to the FCK, the TCK, Clock-DR (TAP), or to a static OFF state. During normal functional operation, CK is connected to FCK. During STP controlled internal scan testing CK may be connected to the TCK as described above. Alternatively during STP controlled internal scan testing, the CK may be connected to the FCK to allow the scan test to operate using the functional clock source. During TAP controlled access to the internal scan circuit 501, say during an in-circuit emulation/debug or TAP controlled internal scan operation, CK is connected to the Clock-DR signal of the TAP controller. During shut down operations, say during times when one or more cores/circuits need to be disabled while other cores/circuits are tested, the CK to the disabled cores/circuits may be connected to the static OFF input to stop all clocking activity in the disabled cores/circuits.

Figure 6:
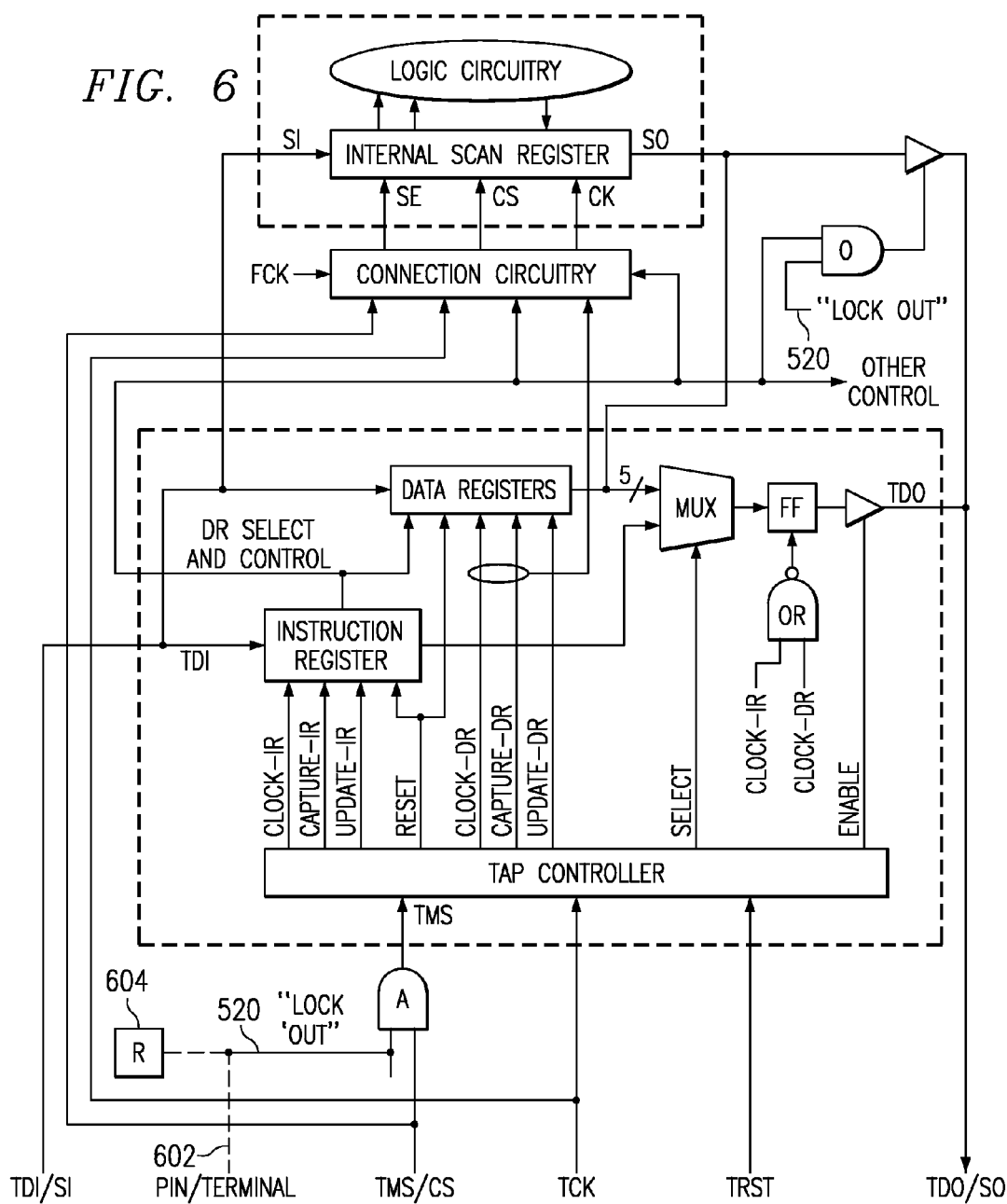
FIG. 6 is an embodiment of the present disclosure illustrating that the source of the Lock Out signal could come from an additional IC pin or core terminal, or from a register (R) or other circuit embedded within the system IC.

FIG. 6 is provided to simply illustrate that the source of the Lock Out signal could come from an additional IC pin or core terminal, or from a register (R) or other circuit embedded within the system IC.

Figure 7:
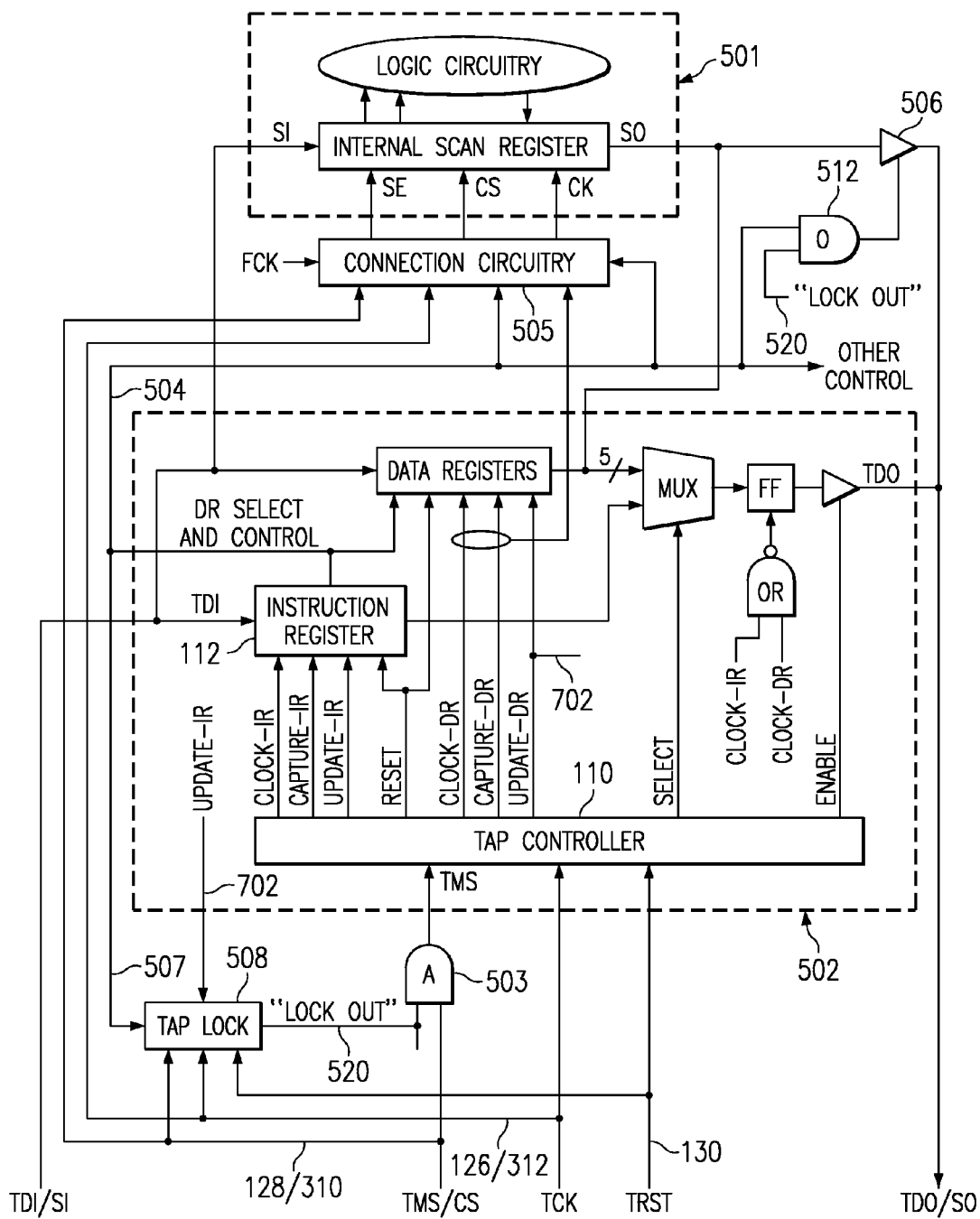
FIG. 7 illustrates an embodiment of the present disclosure for generating the Lock Out signal by the TAP itself and by using only the existing test interface signals.

FIG. 7 illustrates a method and structure for generating the Lock Out signal by the TAP itself and by using only the existing test interface signals (TDI/SI, TMS/CS, TCK, TRST, and TDO/SO). The advantage of producing the Lock Out signal using only the pre-existing test interface signals is that no additional pin/terminal is required on the IC/core, and that testers that drive IC TAP interfaces today can be used to set the Lock Out signal without having to provide an additional hardware test interface signal to drive the Lock Out pin/terminal signal of FIG. 6. As seen in FIG. 7, the modification to include a TAP generated Lock Out signal involves: (1) providing a TAP Lock circuit 508, (2) providing and connecting a Lock Input signal 507 to the TAP Lock circuit 508 from instruction register output bus 504, (3) providing an instruction to produce the Lock Input signal output onto bus 504, (4) connecting the Update-IR signal output from the TAP controller to the Lock Out circuit 508, (5) connecting the TCK input to the Lock Out circuit 508, (6) connecting the TMS/CS input to the Lock Out circuit 508, and (7) connecting the TRST input to the Lock Out circuit 508. The Lock Input signal 507 is output from the instruction register such that the TAP controller Update-IR signal may clock it into the Lock Out circuit 508 during the Update-IR state of FIG. 2, i.e. the Lock Input signal 507 is output from the instruction register prior to the occurrence of the TAP controller's Update-IR signal that occurs at the end of each instruction scan operation.

FIG. 8A illustrates in detail the Lock Out circuit 508. The Lock Out circuit consists of a D-FF 801 for receiving the Lock In signal 507 at its data input, the Update-IR signal at its clock input, and a reset input via AND gate 804. The Lock Out circuit also includes an Unlock state machine 803. The Unlock state machine receives TCK as a clock input, TMS/CS as a data input, TRST as reset input, and the data output of D-FF 801 as an enable input. The Unlock state machine outputs an Unlock signal to the reset input of the D-FF 801, via AND gate 804. TRST is also input to the reset input of D-FF 801 via AND gate 804. In response to the Update-IR signal from the TAP controller, the D-FF outputs the state of the Lock In input to the Unlock state machine and to inverter 802 which outputs the Lock Out output signal. As long as the data output from D-FF 801 is low, the Unlock state machine is disabled and the Lock Out output from inverter 802 is high. While Lock Out is high, the TAP is enabled to respond to the TMS/CS input via AND gate 503, and the SO buffer 506 is disabled as previously described. When an instruction is loaded into the TAP's instruction register to enable an STP controlled scan test operation, the Lock Input will be set high such that, in response to the Update-IR signal, the data output of the D-FF goes high. A high on the data output of the D-FF enables the Unlock state machine and sets Lock Out from inverter 802 low. A low on Lock Out disables the TAP to the Run Test/Idle state and the enables the SO buffer 506 as previously described. Also the instruction outputs control via bus 504 to connection circuit 505 to input the SE signal to scan circuit 501 and to form appropriate CS and CK connections to scan circuit 501 for the STP controlled scan test operation, and to set the SO enable signal to OR gate 512 low, again as previously described.

While Lock Out is low, the Unlock state machine is enabled to monitor the state of the TMS/CS signal during each TCK period. During the STP controlled test operation, the TMS/CS signal input to scan circuit 501 goes low to capture data then goes high to shift data from TDI/SI to TDO/SO. The number of times the Unlock state machine detects a low on TMS/CS is therefore only during the times when the scan circuitry 501 is performing a capture operation. Conventionally, the STP operates to capture data using one TCK period, then shifts data using multiple TCK periods. The Unlock state machine exploits this conventional STP capture and shift timing to devise a simple method of escaping from the STP controlled mode to re-enter the TAP controlled mode. The operation of the Unlock state machine and its escape sequence is best understood by inspection of the Unlock state diagram of FIG. 8B.

As seen in FIG. 8B, the Unlock state machine comprises Idle 1, Idle 2, Sequence 1-3, and Unlock TAP states. When first enabled by the data output of D-FF 801 going high, the Unlock state machine will be in the Idle 1 state and will remain in the Idle 1 state while TMS/CS is low. Holding TMS/CS low to maintain the Idle 1 state when the Unlock state machine is first enabled, provides time for the test interface and architecture to switch from TAP controlled operation to STP controlled operation. For example, during the Update-IR state that enables the Unlock state machine in the Idle 1 state, the CKSEL and CSSEL control signals are input to the CK and CS multiplexers of FIGS. 5C and 5D to couple CK to TCK and CS to TMS/CS, and the Lock Out signal enables SO buffer 506. By holding TMS/CS low to remain in the Idle 1 state for a certain number of TCKs, the CK and CS multiplexers are given time to switch, the scan circuit 501 is given time to respond to the CK and CS switch, and the SO buffer 506 is given time to become enabled. After the CK and SO buffer enable time, the scan circuit 501 will operate in the capture mode since it will be receiving CK inputs (via TCK) while the CS input is low (via TMS/CS being low).

Applying a high level on TMS/CS will initiate the first shift operation through scan circuit 501 from TDI/SI to TDO/SO and cause the Unlock state machine to transition from the Idle 1 state to the Idle 2 state. The Idle 2 state is maintained while TMS/CS is high to complete the first shift operation. At the end of the shift operation, a low level is applied to TMS/CS to initiate a capture operation and to cause the Unlock state machine to transition from the Idle 2 state to the Sequence 1 state. At the end of the capture operation, a high level is applied to TMS/CS to initiate the second shift operation and to transition the Unlock state machine from the Sequence 1 state to the Idle 2 state. The high on TMS/CS maintains the second shift operation until the next capture operation is required, at which time a low level will be applied on TMS/CS. The above shift/capture operation and corresponding Idle 2/Sequence 1 state sequence repeats until the STP controlled test of scan circuit 501 has been completed. At the end of the last shift operation of the STP controlled test, a low level is applied and maintained on TMS/CS which causes the Unlock state machine to transition from the Idle 2 state, through the Sequence 1-3 state, through the Unlock TAP state, to re-enter the Idle 1 state. Passing through the Unlock TAP state, the Unlock state machine outputs an Unlock signal to the reset input of D-FF 801, via AND gate 804. In response to the Unlock signal, the data output of the D-FF goes low, which disables the Unlock state machine to its Idle 1 state and sets the Lock Out from inverter 802 high. When Lock Out goes high, the SO buffer 506 is disabled and the TAP controller is once again enabled to respond to the TMS/CS input via AND gate 503 to provide control of the test architecture. The enabled TAP controller will remain in the Run Test/Idle state if TMS/CS remains low, or, as seen in FIG. 2, it may transition from the Run Test/Idle state to perform a data register scan operation, an instruction register scan operation, or enter the Test Logic Reset state.

In some variances of STP controlled testing, back to back capture operations may occur between shift operations to support delay testing of the scan circuit 501. The Unlock state machine is designed to allow for this back to back capture (i.e. two consecutive lows on TMS/CS) possibility as seen in state transitions from Idle 2 to Sequence 1 to Sequence 2, and back to Idle 2. In fact, as seen in the state diagram, the Unlock state machine can handle up to three back to back capture (i.e. three consecutive lows on TMS/CS) operations without Unlocking the TAP, as seen by state transitions from Idle 2 to Sequence 1 to Sequence 2 to Sequence 3, and back to Idle 2. In general, Unlock state machines are designed to comprehend the total number of consecutive TMS/CS low signals required to perform any given STP controlled test operation. The STP controlled test operation will be maintained as long as the number of consecutive TMS/CS low signals is less than or equal to that total number. If the number of consecutive TMS/CS low signals exceeds that total number, the Unlock state machine will disable STP control and reinstate TAP control of the test architecture, as described above.

FIG. 9 illustrates a system IC including cores 1-N that use the dual mode TAP/STP interface of the present disclosure. In this example, each TAP/STP interface includes a TAP lock circuit 508 of FIGS. 7, 8A, and 8B, so only the IEEE 1149.1 standard TDI, TDO, TMS, TCK, and TRST signal pins are required on the IC for selecting the TAP or STP mode of the TAP/STP interface, i.e. the Lock Out signal pin of FIG. 6 is not required. A first advantage of the present disclosure is that the system IC of FIG. 9 only has to provide a single internal scan path wiring bus 910 to the cores for performing both TAP controlled and STP controlled operations. In contrast, the system IC of FIG. 4 had to provide two internal scan path wiring buses 410 and 420 to the cores, one for the TAP and another for the STP. A second advantage of the present disclosure is that the tester connected to the system IC of FIG. 9 can selectively perform either TAP or STP controlled operations using the same standard IC test pins defined in the IEEE 1149.1 standard, i.e. TDI, TDO, TMS, TCK, and TRST. In contrast, a tester connected to the system IC of FIG. 4 had to provide two separate IC test pin interfaces to the IC, one for the TAP and another for the STP.

At power up of the system IC of FIG. 9, all core TAP/STP interfaces preferably default to the TAP control mode so that the core TAPs can be accessed for scanning in instructions to setup test, emulation, programming, or other TAP controlled operations. When STP controlled scan testing is required in all the cores, a TAP instruction scan will be performed to load an STP enable instruction into each core's TAP instruction register, as described in regard to FIGS. 5A, 6A, 7, and 8A. Once the instruction is updated during the Update-IR state of FIG. 2, all core TAP/STP interfaces switch from the TAP control mode to the STP control mode. Assuming each core has an internal scan circuit 501 as described in FIGS. 5-7, a tester may perform scan testing on all the daisy-chained internal scan circuits 501 of cores 1-N via the single test pin interface and single scan path wiring bus 910. At the end of the STP controlled test operation, TAP control of the core TAP/STP interfaces can be reinstated by setting the TMS/CS signal to a state that will disable the TAP lock circuits 508 to their Idle 2 state, as described in FIGS. 8A and 8B.

In FIG. 9, a dotted line connection 904 is shown formed between the cores to illustrate another example implementation of the present disclosure whereby a single TAP lock circuit of one core (Core1) is used to provide Lock Out signals to other cores (Cores 2-N) which do not themselves have TAP lock circuits. In this example, the TAP lock circuit of Core 1 is equipped with an output terminal 901 for outputting the Lock Out signal to connection 904 and Cores 2-N are equipped with input terminals 902 and 903 for inputting the Lock Out signal from Core 1. Core 1 would utilize the FIG. 7 TAP/STP interface which includes the TAP lock circuit. Cores 2-N would utilize the FIG. 6 TAP/STP interface which does not include the TAP lock circuit, but rather inputs the Lock Out signal via a core terminal. The operation of this alternate realization of the present disclosure to switch between TAP and STP controlled modes is the same as previously described. The use of a single TAP lock circuit to generate the Lock out signal to a plurality of TAP/STP interfaces, as shown in FIG. 9, should be understood to be an alternate method of implementing the present disclosure in all examples described herein. In some implementations, the use of one TAP lock circuit in one TAP/STP interface to generate the Lock out signal to other TAP/STP interfaces as shown in FIG. 9 may be preferred since it eliminates the need for each TAP/STP interface to have its own TAP lock circuit.

As mentioned in the FIG. 9 STP controlled test operation above, all cores 1-N were assumed to have a scan circuit 501 so that all the scan circuits 501 could be daisy-chained onto the scan path wiring bus 910 and tested at the same time. However, not all the cores may have a scan circuit 501. Therefore a method and structure is needed to allow STP controlled daisy-chaining of the core TAP/STP interfaces onto scan path wiring bus 910 when all the cores do not have scan circuits 501, or when testing of only a selected one or more of the scan circuits 501 is desired. The following description of FIGS. 10A-D and 11 provides a method and structure of the present disclosure for selecting the bypass register of the TAP/STP interfaces to be inserted into the scan path wiring bus 901 to provide an alternate daisy-chain arrangement between the cores.

Figure 10A:
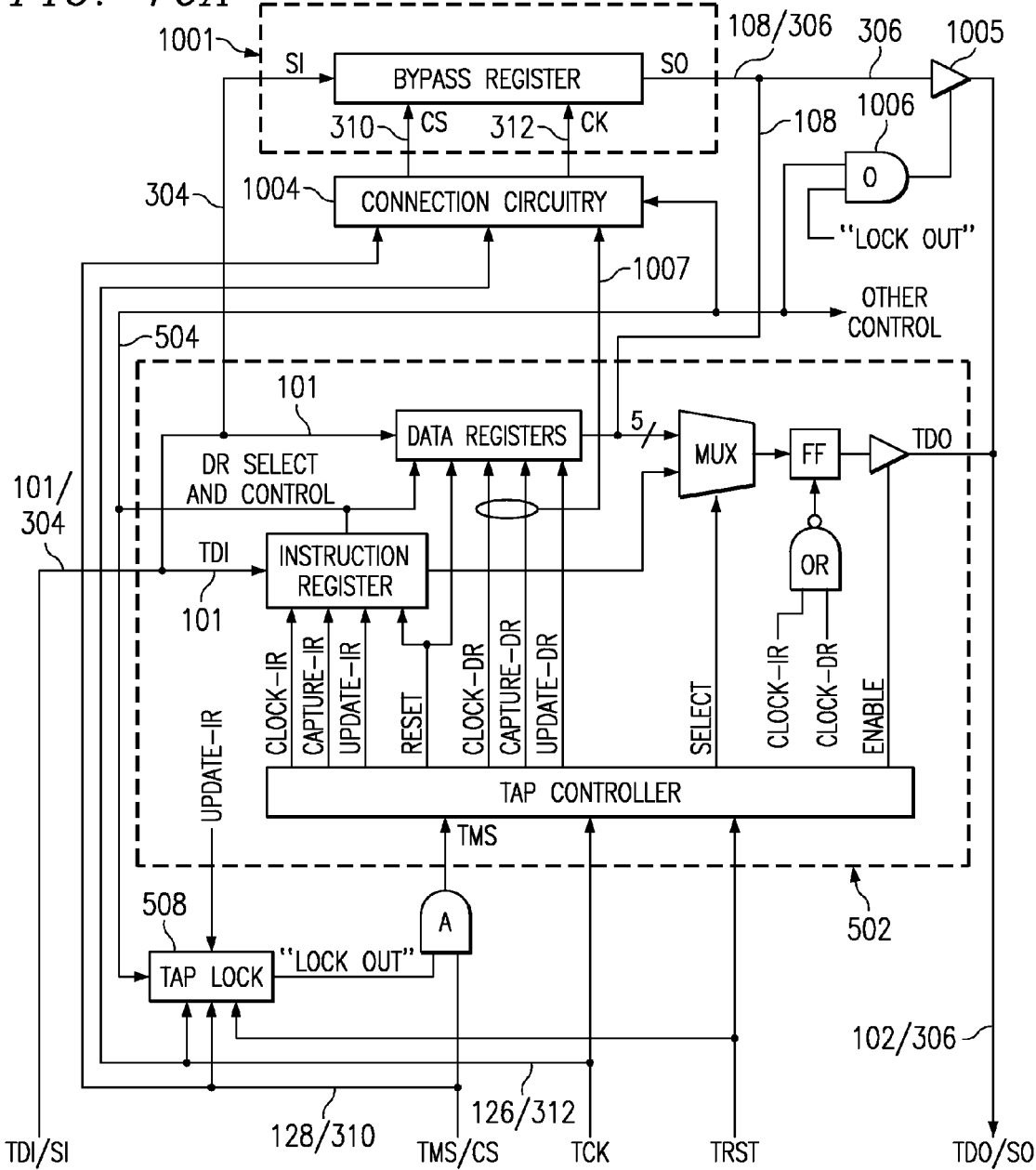
FIG. 10A illustrates a test architecture according to another embodiment of the disclosure.
Figure 10B:
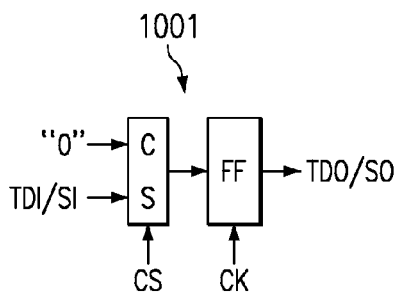
FIG. 10B illustrates a bypass register used in FIG. 10A.
Figures 10C, 10D:
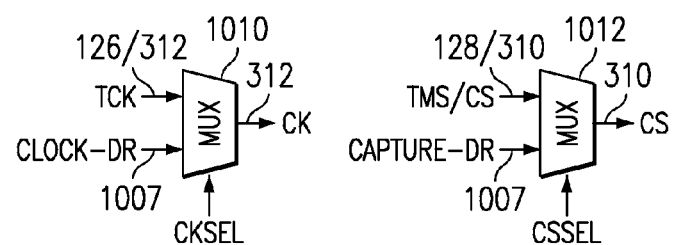
FIGS. 10C and 10D illustrate multiplexers used in FIG. 10A.

FIG. 10A illustrates a test architecture similar to that described in regard to FIG. 7. The difference between the test architecture of FIG. 10A and FIG. 7 is that the TAP's bypass register 1001 of FIG. 1A has been selected for STP controlled scanning instead of the scan circuit 501 of FIG. 7. An example bypass register is shown in FIG. 10B. The serial input of the bypass register 1001 is connected to TDI/SI via connection 101. The serial output of the bypass register is connected to the TAP data registers section via connection 108 to maintain conventional TAP controlled access as described in regard to scan circuit 501 of FIG. 5A. The serial output of the bypass register is also selectively connectable to the TDO/SO output via SO buffer 1005. Connection circuitry 1004 is provided for connecting the TAP controller's Clock-DR and Capture-DR to the bypass registers CK and CS inputs during TAP controlled operation, or for connecting the bypass register CK and CS inputs to TCK and TMS/CS during STP controlled operation. An example CK multiplexer is shown in FIG. 10C, and an example CS multiplexer is shown in FIG. 10D. Both multiplexers reside in connection circuit 1004 and both receive bypass register CK and CS selection signals CKSEL and CSSEL from the TAP instruction register via bus 504.

The process for selecting the bypass register between TDI/SI and TDO/SO and switching the TAP/STP interface into the STP controlled mode is similar to that described for selecting the scan circuit 501 of FIGS. 5-7. While in the TAP controlled mode, a bypass instruction is scanned into and updated from the instruction register. The outputs from the instruction register are input to the TAP lock circuit 508, connection circuit 1004, and OR gate 1006, via bus 504. In response to the signals from bus 504, the TAP lock circuit outputs a low on Lock Out which disables the TAP and enables SO output buffer 1005 via OR gate 1006. The Lock Out signal is allowed to pass through OR gate 1006 since the bypass register SO enable signal to OR gate 106 from the instruction register is set low. Also, in response to the signals from bus 504, connection circuitry 1004 connects TMS/CS to the bypass register's CS input and TCK to bypass register's CK input. It should be noted that the SO buffer 1005, OR gate 1006, and connection circuitry 1004 is separate from the SO buffer 506, OR gate 512, and connection circuitry 505. Also the bypass instruction control signals to connection circuitry 1004, SO buffer 1005, and OR gate 1006 is separate from the scan test instruction control signals to connection circuitry 505, SO buffer 506, and OR gate 512. In general this is true for all data registers (i.e. internal scan, bypass, boundary scan, ISP, and ICE data registers of FIG. 1A) that are required to be individually connected between TDI/SI and TDO/SO and operated in the STP control mode. When the bypass SO buffer 1005 is enabled to drive out on TDO/SO, all other SO buffers (for example the scan circuit SO buffer 506 of FIG. 7) will be disabled to avoid contention during STP controlled testing.

FIG. 11 illustrates an example IC containing cores 1-N. In this example, all the TAP/STP core interfaces have been switched to the STP controlled mode. Cores 1 and 3-N have had their bypass registers 1001 connected between their TDI/SI and TDO/SO terminals, as described in the process above. Core 2 has had its scan circuit 501 connected between its TDI/SI and TDO/SO terminals, as described in regard to FIGS. 5-7. FIG. 11 illustrates an example of how to daisy-chain cores onto scan path wiring bus 910 to where cores not being tested (Cores 1, 3-N) select their bypass registers 1001 to be in the daisy-chain scan path 910 while cores being tested (Core 2) select their scan circuit 501 to be in the daisy-chain scan path 910. During the STP controlled capture operation the bypass registers 1001 of Cores 1 and 3-N capture a logic low, as shown in FIG. 10B, and the scan circuit 501 of Core 2 captures test response data. During the STP controlled shift operation the bypass registers 1001 of Cores 1 and 3-N shift data along the scan path 910 from the their TDI/SI input to TDO/SO output terminals as shown in FIG. 10B, and the scan circuit 501 of Core 2 shifts data along scan path 910 from its TDI/ST input to TDO/SO output terminals.

Figure 12A:
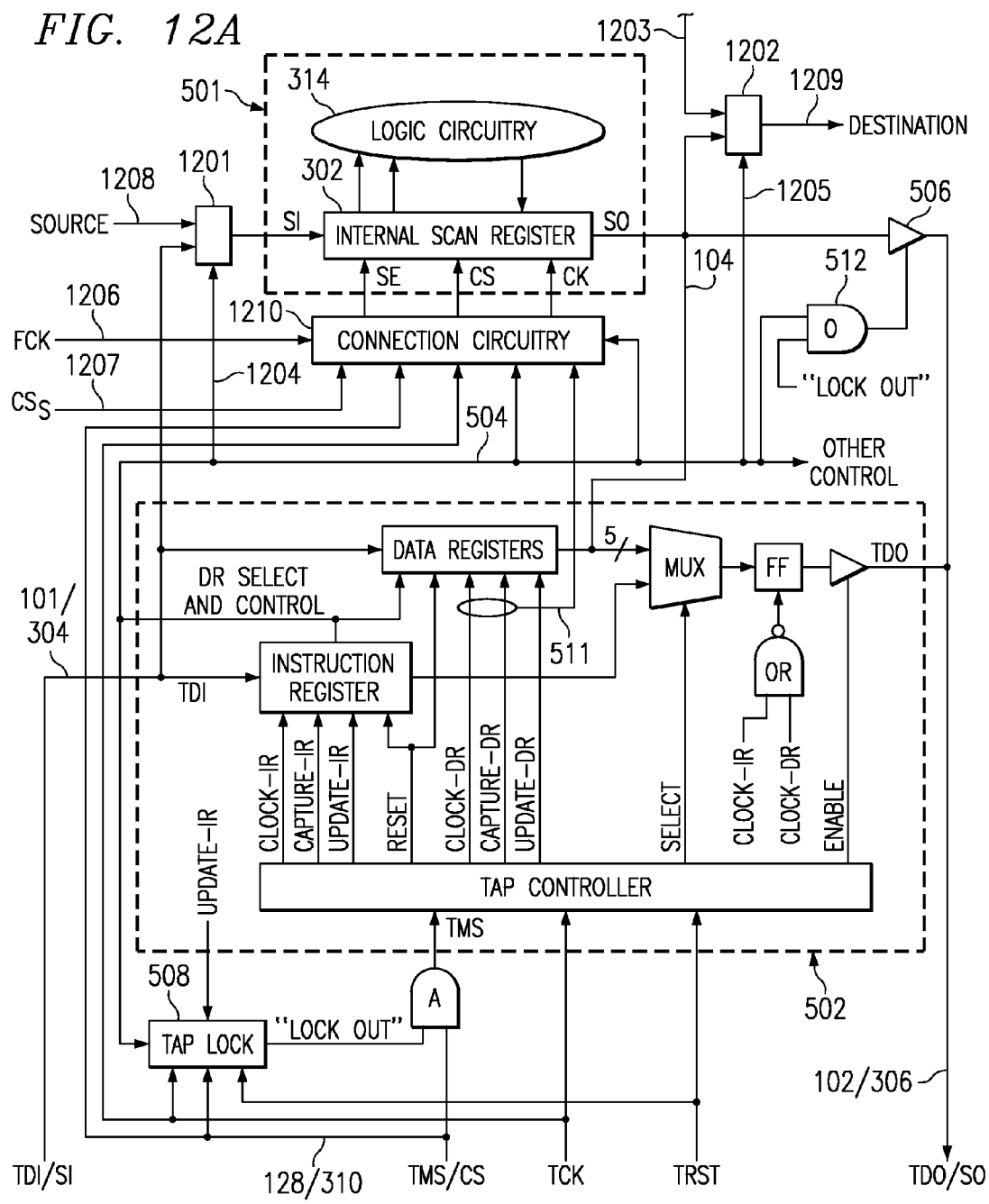
FIG. 12A illustrates a test architecture according to another embodiment of the disclosure.

FIG. 12A illustrates another example configuration of the present disclosure whereby the serial input and serial output of scan circuit 501 are multiplexed to a test pattern source and a test pattern destination, respectively. The test pattern source 1208 could be internally generated by a circuit within the IC, such as a linear feedback shift register, or it could be externally input from a tester via an IC pin. The test pattern destination 1209 could be internally processed by a circuit within the IC, such as a signature analyzer, or it could be externally output to a tester via an IC pin. The TAP/STP interface is similar to that described in FIGS. 5-7. The key differences between the TAP/STP interface of FIG. 12A and the TAP/STP interfaces of FIGS. 5-7 include; (1) multiplexer 1201 is provided to selectively connect the serial input of scan circuit 501 to either source 1208 or TDI/SI 101, (2) multiplexer 1203 is provided to selectively connect the serial output of scan circuit 501 to destination 1209 in substitution of functional signal 1203, (3) the FCK signal 1206 is made available at a core terminal or IC pin to serve as the CK input to scan circuit 501, (4) a capture shift signal source (CSs) is provided and made available at a core terminal or IC pin to serve as the CS input to scan circuit 501, and (5) a source/destination test instruction is provided that, when shifted into and updated from the TAP instruction register, provides control on bus 504 to multiplexers 1201 and 1202 and to connection circuitry 1210, to connect scan circuit 501 to the source, destination, FCK, and CSs signals. While a multiplexer 1202 is shown for connecting the serial output of scan circuit 501 to the destination 1209, in substitution of a functional signal 1203, the serial output may be coupled to the destination using a source/destination instruction controlled 3-state buffer as well. For cores, the serial output from scan circuit 501 may have a dedicated output terminal for connecting to destination 1209.

Figure 12B:
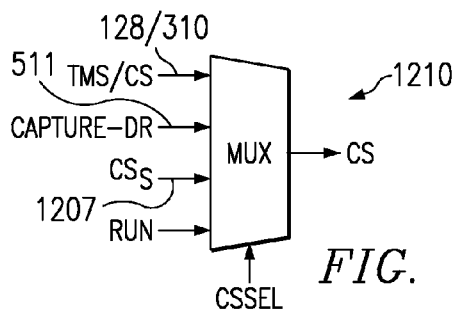
FIG. 12B illustrates a multiplexer used in FIG. 12A.

Connection circuitry 1210 comprises a CK multiplexer like that shown in FIG. 5C to allow the FCK 1206 signal to be coupled to the scan circuit's 501 CK input in response to the source/destination test instruction output on bus 504. The connection circuitry 1210 also includes the CS multiplexer of FIG. 12B, to allow CSs 1207 to be coupled to the scan circuits CS input, in response the source/destination test instruction output on bus 504. In addition to the test source and destination test mode configuration described above, the TAP/STP interface of FIG. 12A maintains the previously described TAP and STP controlled test modes to scan circuit 501. Also it is should be understood that the new source and destination test mode operates independent of the TAP/STP interface, once the source/destination test instruction has been loaded. Further, the TAP/STP interface may be placed in either the TAP controlled or STP controlled mode by the source/destination test instruction without effecting the operation of the source and destination tests. Indeed, two source/destination test instructions may be used. A first source/destination test instruction may configure scan circuit 501 for source and destination testing as described above and leave the TAP/STP interface in the TAP controlled mode. A second source/destination test instructions may configure scan circuit 501 for source and destination testing as described above and place the TAP/STP interface into the STP controlled mode.

FIG. 13 illustrates an example IC containing cores 1-N having TAP/STP interfaces coupled to scan path 910. Each core includes the source and destination test mode described in regard to FIG. 12A. When the source/destination test instruction is loaded into the cores, each core connects its source input 1208 to a respective internal or external source 1301, 1303, 1305, connects its destination output 1209 to a respective internal or external destination 1302, 1304, 1306, connects its CSs input 1207 to a respective internal or external CSs 1307, 1309, 1311, and connects its FCK input 1206 to a respective internal or external FCK 1308, 1310, 1312. Once the source and destination configuration is made, the scan circuits 501 of the cores 1-N can be tested. During the test, the core's CSs 1207 and FCK 1206 inputs are operated to capture data and shift data through the scan circuits 501 from the source inputs 1208 to the destination outputs 1209. Separate CSs 1307, 1309, 1311, FCKs 1308, 1310, 1312, sources 1301, 1303, 1305, and destinations 1302, 1304, 1306 may be used for each core for asynchronous core testing, or alternately each core may be interfaced to the same CSs and FCK to allow communication between the core 1-N sources and destinations to occur synchronously. While source and destination testing occurs, the core's TAP/STP interfaces may be accessed via scan path 910 without interfering with the source destination testing. Also the core TAP/STP interfaces may be accessed using either TAP control or STP control.

Figure 14:
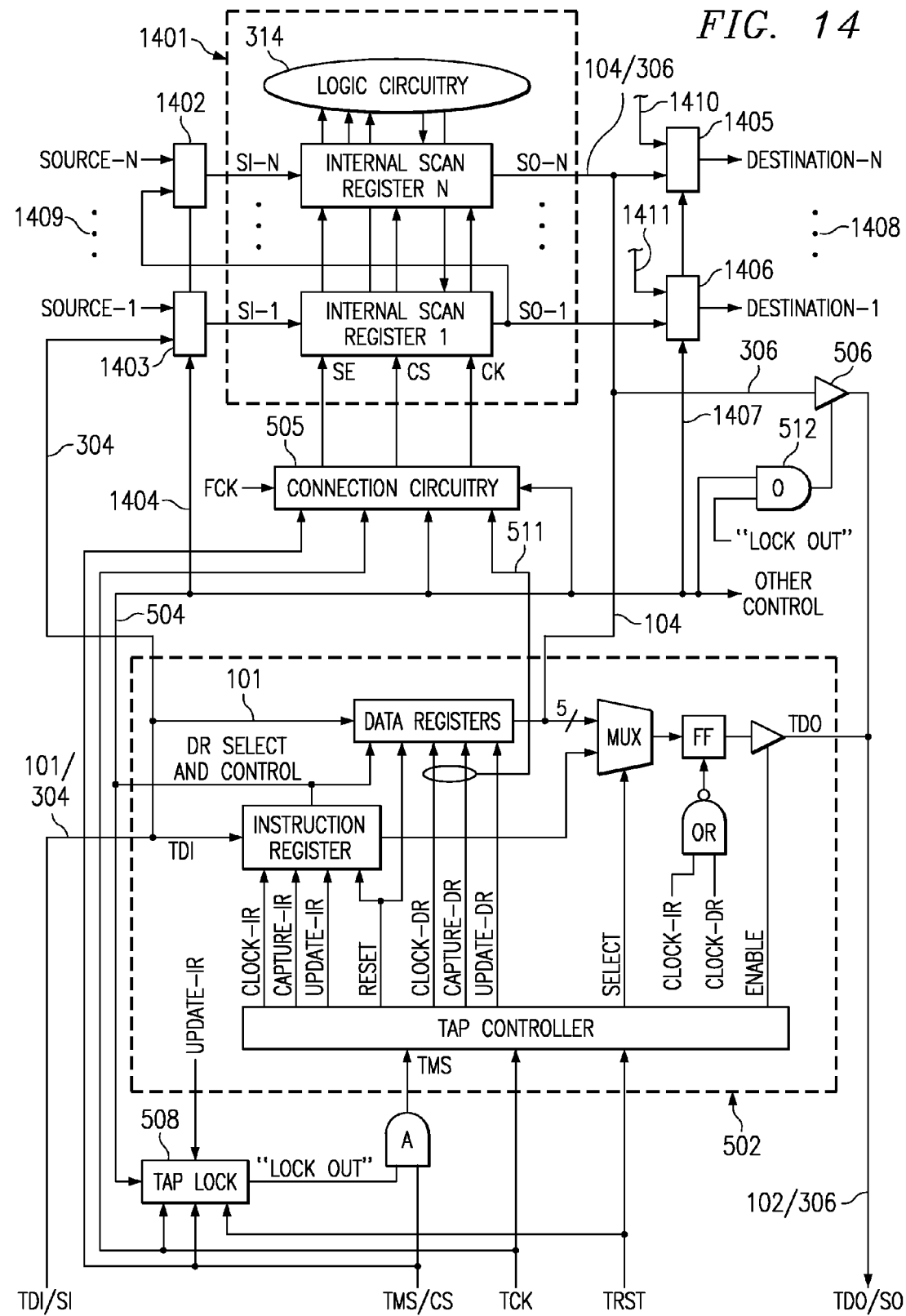
FIG. 14 illustrates an embodiment of the disclosure having a configurable scan circuit.

FIG. 14 illustrates another example configuration of the present disclosure whereby a configurable scan circuit 1401 is substituted for scan circuit 501. The logic circuitry of scan circuit 1401 can be tested in a first configuration where the scan circuit 1401 scan path is configured into a single scan register, or in a second configuration where the scan circuit 1401 scan path is configured into separate parallel scan registers 1-N. When placed in the first configuration, the single scan register can be coupled between TDI/SI and TDO/SO and tested using either the TAP or STP as previously described for scan circuit 501. When placed in the second configuration, the serial inputs of the separate parallel scan registers 1-N are coupled to parallel sources 1-N 1409 via multiplexers 1402-1403, and the serial outputs of the separate parallel scan registers 1-N are coupled to parallel destinations 1-N 1408 via multiplexers 1405-1406. The sources 1409 and destinations 1408 can be internally or externally provided, as described in regard to FIG. 12A.

The key differences between the TAP/STP interface of FIG. 14 and TAP/STP interfaces of FIGS. 5-7 and 12A include; (1) multiplexer 1402 is provided to selectively connect the serial input of parallel scan register N to either source N or the serial output of parallel scan register N-1, or in this example where N=2, to the serial output of parallel scan register 1, (2) multiplexer 1403 is provided to selectively connect the serial input of parallel scan register 1 to either source 1 or TDI/SI 101, (3) multiplexer 1405 is provided to selectively connect the serial output of parallel scan register N to destination N in substitution of functional a signal 1410, (4) multiplexer 1406 is provided to selectively connect the serial output of parallel scan register 1 to destination 1 in substitution of a functional signal 1411, (5) a serial test instruction is provided that, when shifted into and updated from the TAP instruction register, provides control on bus 504 to multiplexers 1402-1403 and 1405-1406 to serially connect parallel scan registers 1-N into a single scan path for TAP or STP access via TDI/SI and TDO/SO, (6) a parallel test instruction is provided that, when shifted into and updated from the TAP instruction register, provides control on bus 504 to multiplexers 1402-1403 and 1405-1406 to connect the parallel scan registers 1-N to sources 1-N and destinations 1-N for TAP or STP controlled access via sources 1-N and destinations 1-N.

In response to either of the above serial or parallel test instructions, connection circuit 505 receives control on bus 504 to operate the scan registers of scan circuit 1401 in either the TAP or STP controlled mode, as previously described. As with the source/destination test instruction of FIG. 12A, both TAP and STP controlled versions of the serial test instruction and a parallel test instruction may be provided to allow the serial and parallel configurations of scan circuit 1401 to be controlled by either the TAP or STP.

Figure 15:
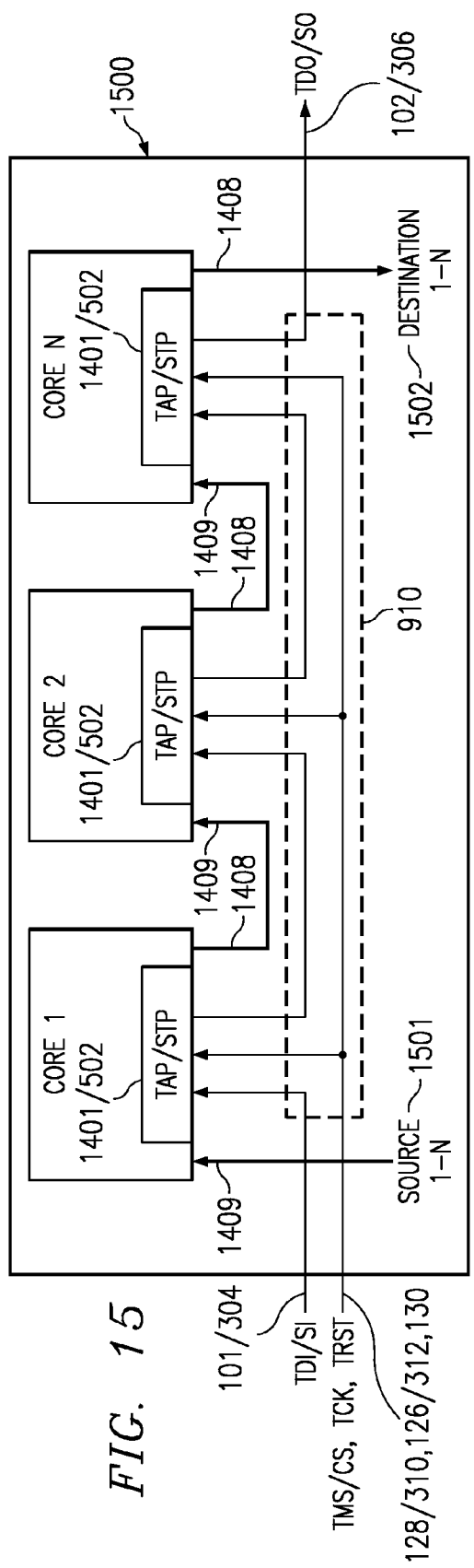
FIG. 15 illustrates a fourth embodiment of a system IC including cores 1-N that use the dual mode TAP/STP interface of the present disclosure.

FIG. 15 illustrates an example IC containing cores 1-N having TAP/STP interfaces coupled to scan path 910. Each core includes the serial and parallel scan test access modes to scan circuit 1401 as described in regard to FIG. 14. When the serial test instruction is loaded into the cores, the scan circuits 1401 are accessed and tested using only the scan path 910 signals, and using either TAP or STP control. The operation of the serial test instruction in FIG. 15 to test daisy-chained scan circuits 1401 is similar in operation to the scan test instruction of FIG. 9 to test daisy-chained scan circuits 501. When the parallel test instruction is loaded into the cores, the scan circuits 1401 of cores 1-N are coupled to source 1-N inputs 1409 and destination 1-N output 1408. As seen in FIG. 15, the source 1-N input of Core 1 is connected to a source 1501 which can be either internally or externally provided. The destination 1-N output of Core 1 is connected to the source 1-N input of Core 2. The destination 1-N output of Core 2 is connected to the source 1-N input of Core N. The destination 1-N output of Core N is connected to destination 1502 which can be either internally or externally provided. In this arrangement, the scan circuits 1401 of cores 1-N are seen to be daisy-chained on a parallel scan bus beginning at source 1501 and ending a destination 1502. The TMS/CS and TCK input signals to the core TAP/STP interfaces from scan path 910 are used to control the capture of data and the shifting of data through the daisy-chained scan circuits 1401 from source 1501 to destination 1502. The capturing and shifting of data through the daisy-chained scan circuits 1401 can be either TAP or STP controlled.

Figure 16:
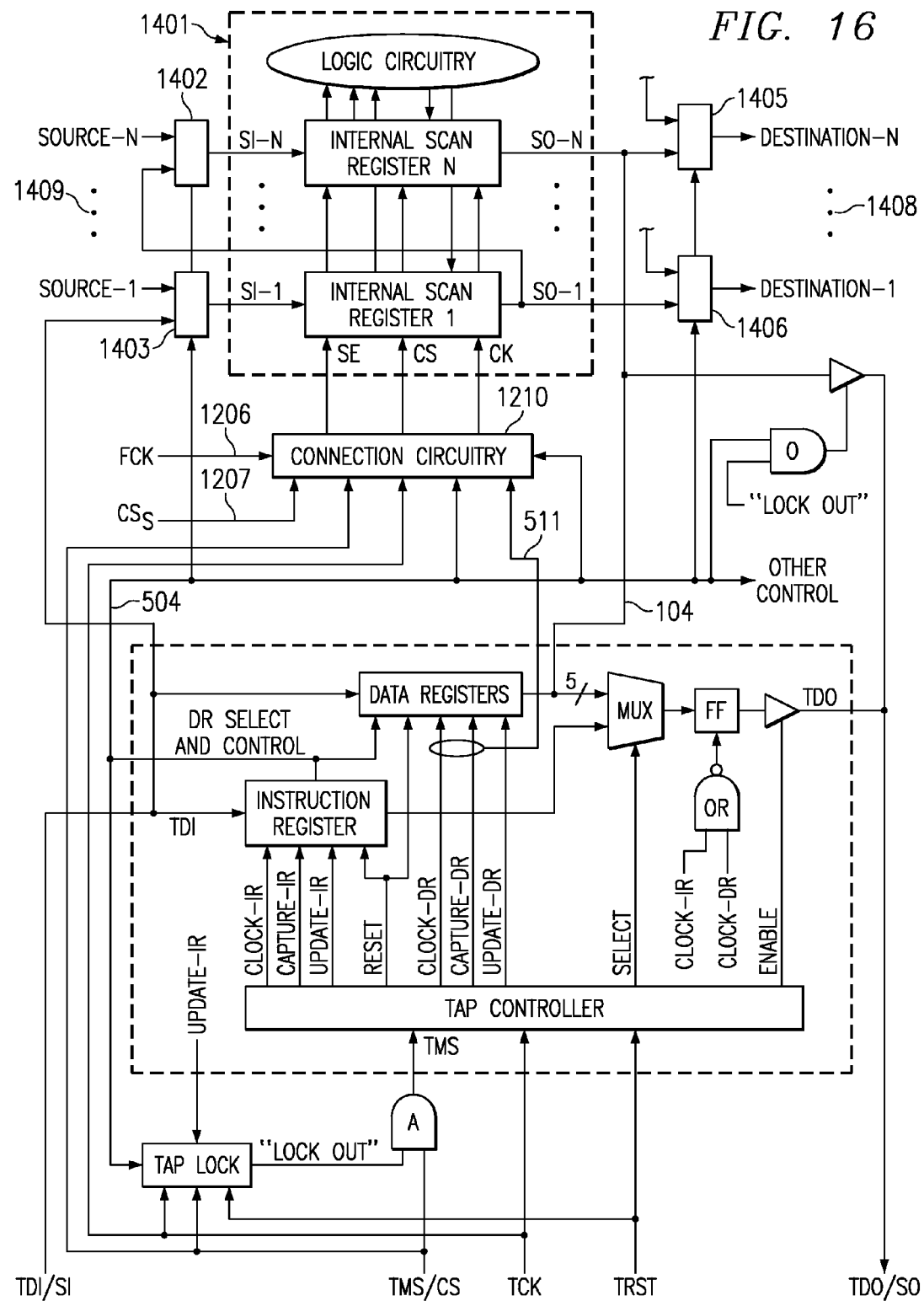
FIG. 16 illustrates another embodiment of the disclosure having a configurable scan circuit.

FIG. 16 illustrates another example configuration of the present disclosure whereby the configurable scan circuit 1401 FIG. 14 is made controllable from the FCK 1206 and CSs 1207 inputs to connection circuitry 1210 as described earlier in regard to FIG. 12A. The FIG. 16 example maintains the serial and parallel test instruction modes described in regard to FIGS. 14 and 15. Additionally, the FIG. 16 example provides a parallel source/destination test instruction that enables the FCK and CSs inputs to control the capture and shift operations of scan circuit 1401. The parallel source/destination instruction is similar to the source/destination instruction of the FIG. 12A example. The key difference is that scan circuit 1401 is connected to parallel source 1-N inputs 1409 and parallel destination 1-N outputs 1408, as opposed to the scan circuit 501 being connected to a single source input 1208 and a single source output 1209.

Figure 17:
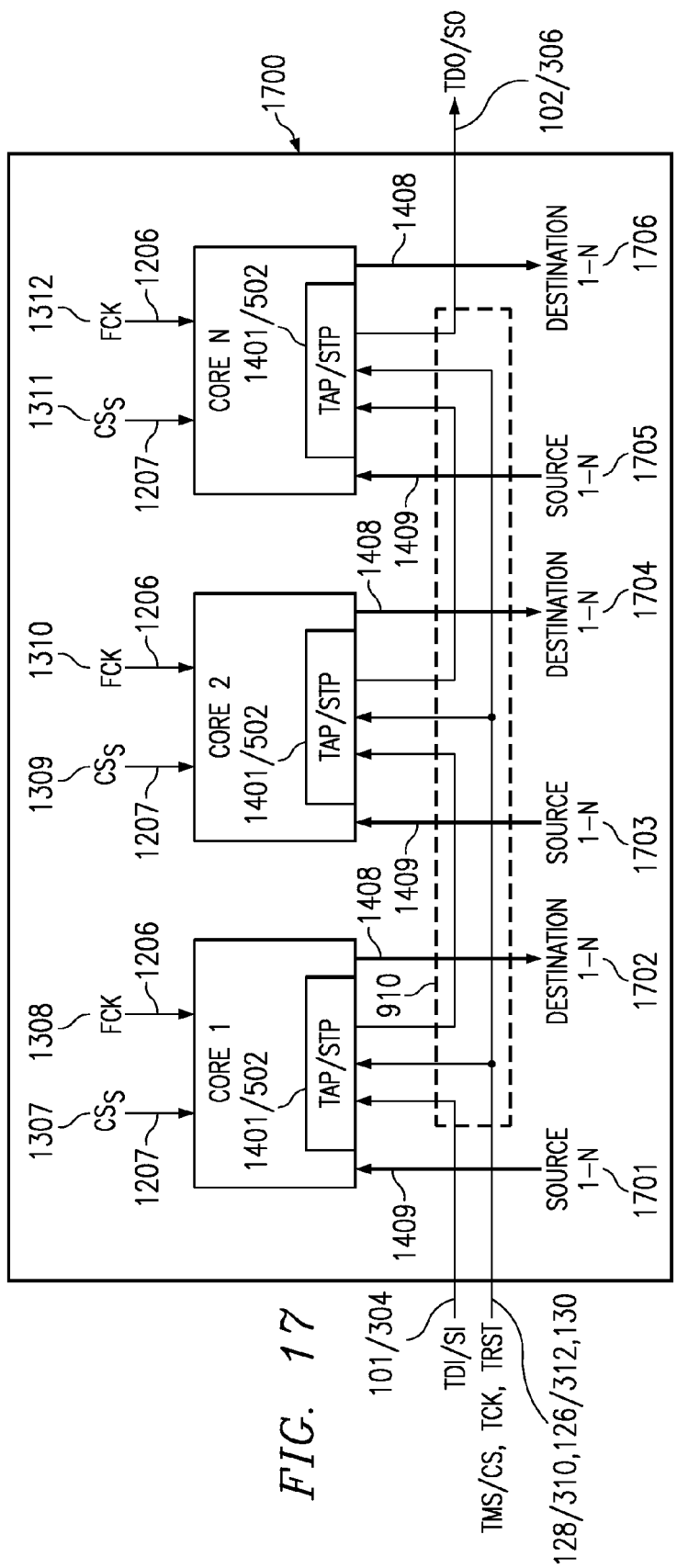
FIG. 17 illustrates a fifth embodiment of a system IC including cores 1-N that use the dual mode TAP/STP interface of the present disclosure.

FIG. 17 illustrates an example IC containing cores 1-N having TAP/STP interfaces coupled to scan path 910. Each core includes the parallel source and destination test mode described in regard to FIG. 16. When the parallel source/destination test instruction is loaded into the cores, each core connects its parallel source input 1409 to a respective internal or external parallel source 1701, 1703, 1705, connects its parallel destination output 1408 to a respective internal or external parallel destination 1702, 1704, 1706, connects its CSs input 1207 to a respective internal or external CSs 1307, 1309, 1311, and connects its FCK input 1206 to a respective internal or external FCK 1308, 1310, 1312. Once the parallel source and destination configuration is made, the scan circuits 1401 of the cores 1-N can be tested. During the test, the core's CSs 1207 and FCK 1206 inputs are operated to capture data and shift data through the scan circuits 1401 from the source inputs 1409 to the destination outputs 1408. Separate CSs 1307, 1309, 1311, FCKs 1308, 1310, 1312, sources 1701, 1703, 1705, and destinations 1702, 1704, 1706 may be used for each core for asynchronous core testing, or alternately each core may be interfaced to the same CSs and FCK to allow communication between the core 1-N sources and destinations to occur synchronously. While parallel source and destination testing occurs, the core's TAP/STP interfaces may be accessed via scan path 910 without interfering with the parallel source destination testing. Also the core TAP/STP interfaces may be accessed using either TAP control or STP control.

FIG. 18 illustrates an example of how the present disclosure may be used to simultaneously enable and execute different types of testing on different cores 1-N within an IC. Core 1 has been loaded with the source/destination test instruction previously described in regard to FIGS. 12A and 13. Core 2 has been loaded with the scan test instruction as previously described in regard to FIGS. 5-9. Cores 3-N have been loaded with the parallel source/destination test instruction described in regard to FIGS. 16-17. To setup the test, a single TAP controlled instruction scan may be performed to load each of the above mentioned test instructions into the TAP/STP interfaces of each core 1-N. Following the instruction scan, Core 1 is configured for source and destination testing as described in FIGS. 12A and 13, Core 2 is configured for scan testing as described in regard to FIGS. 5-9, and Cores 3-N is configured for parallel source and destination testing as described in regard to FIGS. 16-17.

As seen in FIG. 18, the source destination test instruction loaded into Core 1 selects the bypass register 1001 to be coupled between Core 1's TDI/SI and TDO/SO terminals. Also the parallel source destination test instruction loaded into Cores 3-N selects the bypass register 1001 to be coupled between each of the Core 3-N TDI/SI and TDO/SO terminals. The bypass registers 1001 are selected to allow access to and testing of scan circuit 501 of Core 2 via scan path 910, while Cores 1 and 3-N are being tested using the described source and destinations test methods. To enable access to Core 2's scan circuit 501, the source destination test instruction loaded into Core 1 and the parallel source destination instructions loaded into Cores 3-N are designed to not only configure Cores 1 and 3-N for their respective source and destination testing, but also to select the bypass register 1001 between TDI/SI and TDO/SO. Additionally, the TAP/STP interfaces of cores 1-N may be selectively set by the instructions to operate the TAP/STP interfaces in either the TAP or STP controlled mode.

If TAP/STP interfaces are set to operate in the TAP controlled mode, the bypass registers of Cores 1 and 3-N and the scan circuit 501 of Core 2 will operate on scan path 910 according to the TAP state machine state diagram of FIG. 2. If set to operate in the STP controlled mode, the bypass registers of Cores 1 and 3-N and the scan circuit 501 of Core 2 will operate on scan path 910 according to the STP capture and shift scan protocol. The TAP or STP controlled testing of scan circuit 501 of Core 2 does not interfere with the source and destination testing of Cores 1 and 3-N because the signals used for the source and destination testing (i.e. CSs 1207, FCK 1206, source 1208, destination 1209, source 1-N 1407 and destination 1-N 1408) are separate from the scan path 910 signals (i.e. TDI/SI, TMS/CS, TCK, TRST, and TDO/SO). Therefore the cores of FIG. 18 may be tested in parallel using the three different test methods illustrated and described. In general, FIG. 18 illustrates how the TAP/STP interface of the present disclosure and the instructions defined for the TAP/STP interfaces may be used to allow scan path 910 to be used for TAP or STP controlled testing simultaneous with testing performed by signals separate from the TAP/STP interface signals.

Figure 19A:
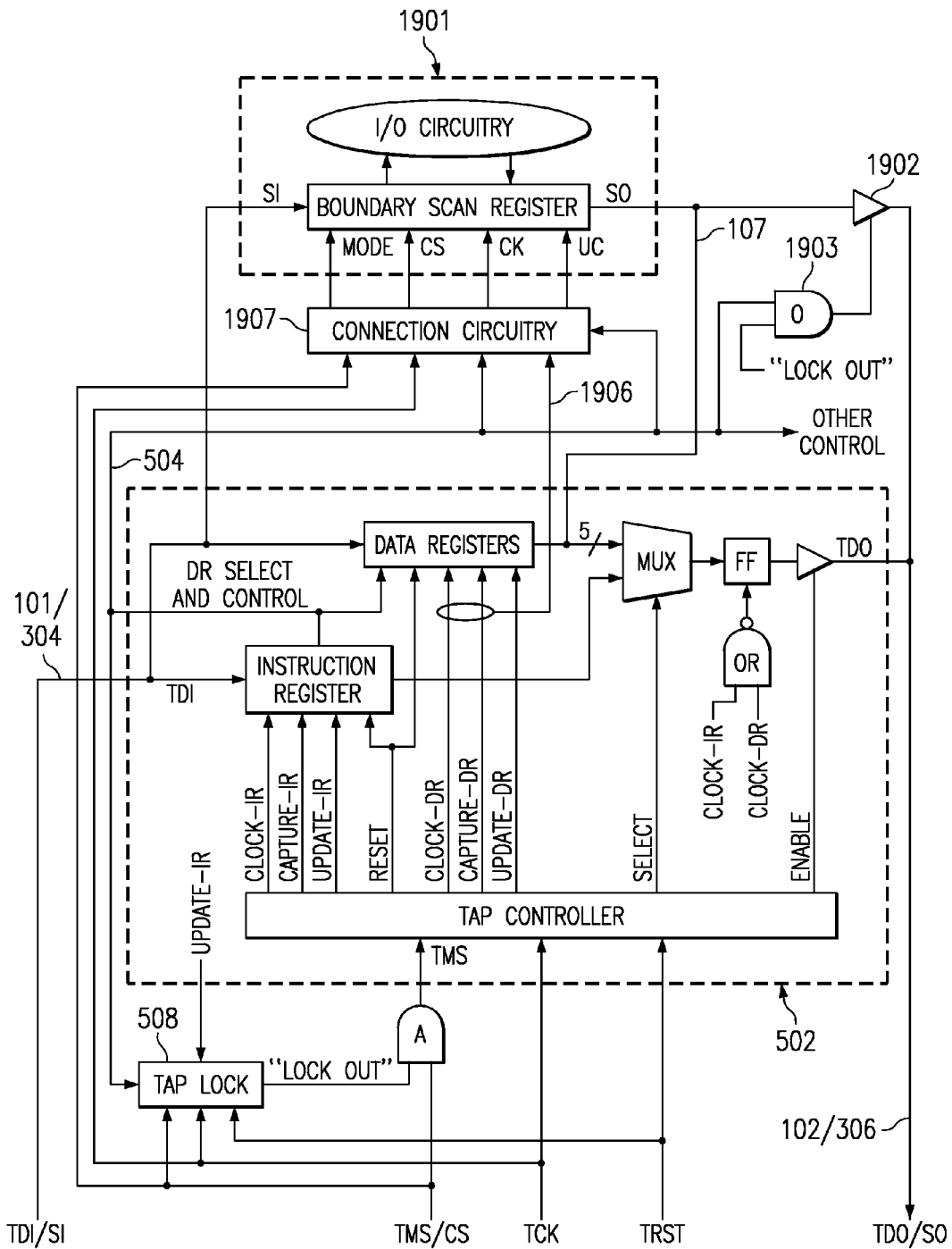
FIG. 19A illustrates a test architecture according to another embodiment of the disclosure.

FIG. 19A illustrates a test architecture similar to that described in regard to FIG. 7. The difference between the test architectures of FIG. 19A and FIG. 7 is that the TAP's boundary scan register 1901 of FIGS. 1A and 1F has been selected for STP controlled scanning instead of the scan circuit 501 of FIG. 7. An example boundary scan cell is shown in FIG. 19B. The boundary scan cell receives a functional input (FI), a serial input (SI) input, CS input, CK input, update control (UC) input, and a mode input. The boundary scan cell outputs a functional output (FO) and a serial output (SO). The mode control input comes from the TAP instruction register and allows coupling FI to FO during functional operation, or coupling FO to the output of the update FF 1904 during test operation. The multiplexer and FF combination 1905 provides for capturing FI data and shifting data from SI to SO in response to the CS and CK signals. Update FF 1904 loads data from FF 1905 in response to the UC signal. The boundary scan register comprises multiple ones of the boundary scan cells of FIG. 19B connected serially between their SI and SO. All the boundary scan cells are commonly connected to the mode, CS, CK, and UC signals. The serial input of the boundary scan register 1901 is connected to TDI/SI via connection 101. The serial output of the boundary scan register is connected to the TAP data registers section via connection 107 to maintain conventional TAP controlled access to the boundary scan register, as mentioned in regard to FIG. 5A. The serial output of the boundary scan register is also selectively connectable to the TDO/SO output via SO buffer 1902. Connection circuitry 1907 is provided for connecting the TAP controller's Clock-DR, Capture-DR, and Update-DR to the boundary scan register's CK, CS and UC inputs respectively during TAP controlled operation, or for connecting the boundary scan register's CK, CS, and UC inputs to TCK, TMS/CS, and a STP update control (STPUC) signal respectively during STP controlled operation. The STPUC signal will be described in more detail in regard to FIG. 20AC. An example CK multiplexer is shown in FIG. 19C, an example UC multiplexer is shown in FIG. 19D, and an example CS multiplexer is shown in FIG. 19E. All multiplexers reside in connection circuit 1907 and all receive boundary scan register CK, CS, UC selection signals CKSEL, CSSEL, and UPSEL from the TAP instruction register via bus 504.

The process for selecting the boundary scan register between TDI/SI and TDO/SO and switching the TAP/STP interface into the STP controlled mode is similar to that described for selecting the scan circuit 501 of FIGS. 5-7. While in the TAP controlled mode, a boundary scan instruction is scanned into and updated from the instruction register. The outputs from the instruction register are input to the TAP lock circuit 508, connection circuit 1907, and OR gate 1903, via bus 504. In response to the signals from bus 504, the TAP lock circuit outputs a low on Lock Out which disables the TAP and enables SO output buffer 1902 via OR gate 1903. The Lock Out signal is allowed to pass through OR gate 1903 since a boundary scan register SO enable signal to OR gate 1903 from the instruction register is set low. Also, in response to the signals from bus 504, connection circuitry 1907 connects TMS/CS to the boundary scan register's CS input, the TCK to boundary scan register's CK input, and the STPUC signal to the boundary scan register's UC input. Again, it should be noted that the SO buffer 1902, OR gate 1903, and connection circuitry 1907 is separate from the SO buffers 506 and 1005, OR gates 506 and 1005, and connection circuits 505 and 1004 of FIGS. 5A and 10A. Also the boundary scan instruction control signals to connection circuitry 1907, SO buffer 1902, and OR gate 1903 is separate from the scan test instruction and bypass instruction control signals to connection circuitry 505 and 1004, SO buffers 506 and 1005, and OR gates 512 and 1006. When the boundary scan register SO buffer 1902 is enabled to drive out on TDO/SO, all other SO buffers 506 and 1005 are disabled to avoid contention during STP controlled boundary scan testing.

FIG. 20A illustrates an example timing diagram of STP controlled scan operations to the boundary scan register 1901 of FIG. 19A. During STP controlled operations, the boundary scan register CS input is driven by TMS/CS via the multiplexer of FIG. 19E, the CK input is driven by TCK via the multiplexer of FIG. 19C, and the UC input is driven by STPUC via the multiplexer of FIG. 19D. Each STP controlled boundary scan operation cycle is defined by; (1) a shifting step where data is shifted through FF's 1905 from TDI/SI to TDO/SO, (2) an update step where the data shifted into FFs 1905 is updated into FFs 1904, and (3) a capture step where FI data is captured into FFs 1905. In this STP controlled example, shifting of data through the boundary scan register 1901 occurs on the rising edge of each CK while CS is high, from a first shift to a last shift. Following the last shift, the CS transitions low. On the falling edge of the last shift CK, and while CS is low, the UC is generated to produce the update step mentioned above. The STPUC signal that drives the UC signal is produced in response to the TMS/CS and TCK signals. FIG. 20B illustrates and example circuit for producing the STPUC signal in response to appropriate TMS/CS and TCK signal conditions. The UC signal clocks FFs 1904 to update the data from FFs 1905 to the FO outputs of the boundary scan register. On the next rising CK edge after the update step, FFs 1905 perform the capture step of loading data from the FI inputs of the boundary scan register. These shift update and capture steps are indicated in the timing diagram of FIG. 20A and are repeated during each STP controlled boundary scan cycle.

In the timing diagram, the capture step occurs one half of a CK period after the update step. This allows STP controlled boundary scan test operations to be more effective at performing delay tests than conventional TAP controlled boundary scan test operations. This improved delay testing advantage will be described in more detail in regard to FIGS. 21 and 22.

The STP controlled timing can be used to simultaneously operate both the boundary scan cell 2010 and internal scan cell 2011 types of FIG. 20C. The advantage of being able to operate both cell types during STP controlled testing will be described in more detail in regard to FIG. 22.

FIG. 21 illustrates an IC containing cores 1-3, each core containing a TAP/STP interface coupled to tester controlled scan path 910 and a boundary scan register 1901. In this example, the cores have been setup, as described in regard to FIG. 19A, for STP controlled boundary scan testing of connection circuits 2101-2104. Core 1 interfaces to the external tester via connection circuitry 2101, Cores 1 and 2 interface internally via connection circuit 2102, Cores 2 and 3 interface internally via connection circuit 2103, and Core 3 interfaces to the external test connection circuit 2104. Connection circuits 2101-2104 are the functional connections between the cores and IC input and output pins to enable the cores to operate and produce the IC's intended functionality. Connection circuits 2101-2104 contain both simple connections that pass signals through wires and complex connections that pass signals through logic circuitry. Both simple and complex connection types need to be tested using the STP controlled boundary scan test operation.

The STP controlled boundary scan testing is achieved by the tester controlling the scan path 910 to repetitively cycle the core TAP/STP interfaces through the shift, capture, and update steps described in regard to FIG. 20A. The shift step loads stimulus data into the boundary scan registers (BSR) 1901 from the tester and unloads capture response data from the BSRs 1901 to the tester. Following the shift step, the update step outputs the loaded stimulus data from the FO outputs of the BSRs. Following the update step, the capture step loads response data into the BSRs from the FT inputs. During the update and capture step sequence, test signals pass through connection circuits 2101-2104 to test both the simple and complex connection types. Connection circuits 2102 and 2103 are tested by using only the BSRs 1901 of cores 1, 2, and 3. Connection circuits 2101 and 2104 are tested using the external tester and BSRs 1901 of cores 1 and 3.

Two types of STP controlled boundary scan tests may be performed, a structural test which verifies that test signals can propagate through the simple and complex connections, and a delay test which verifies that the test signals propagate through the simple and complex connections within a given amount of time. The structural test may successfully propagate the test signals through the connections, but the IC may fail to operate at its rated speed due to certain ones of the connections having a slow signal propagation time. Therefore, the delay test is important since it allows testing that the test signals can successfully propagate through the connection within a time frame that enables the IC to operate at it rated speed. A TAP controlled boundary scan test can also perform the structural and delay tests. A TAP controlled structural test is just as effective as the STP controlled structural test. However, as will described below, a TAP controlled delay test is not as effective as the STP controlled delay test.

From the timing diagram of FIG. 20A it is seen that the STP controlled capture step occurs on the rising CK edge following the falling CK edge that initiates the update step. If CK is driven by the tester at a high frequency, very effective delay testing can be achieved using STP controlled boundary scan testing since the delay test occurs within one half a CK period. TAP controlled delay testing is not as effective as STP controlled delay testing do to the state transition mapping of the TAP controller state machine of FIG. 2. For example, the steps of updating data in the Update-DR state then capturing data in the Capture-DR state are separated in time by two and one half CK periods (CK is TCK). This can be seen by the rising CK edge activated state transitions from Update-DR to Select-DR to Capture-DR to Shift-DR, and by recognizing that data is updated on the falling edge of CK during the Update-DR state and captured on the rising edge of CK during the Capture-DR to Shift-DR state transition. Thus a TAP controlled delay test operates using two and a half CK periods, as opposed to the one half CK period used in the STP controlled delay test.

Figure 22:
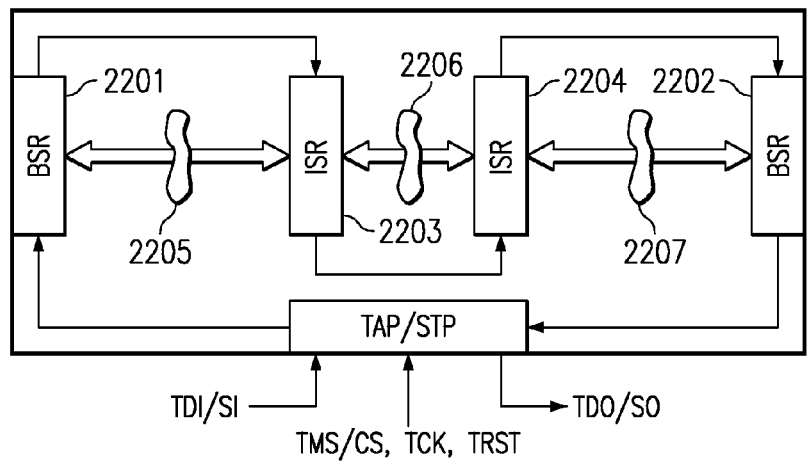
FIG. 22 illustrates an IC or core being tested via the TAP/STP interface.

FIG. 22 illustrates an IC or core being tested via the TAP/STP interface. In this example, the boundary scan registers (BSR) 2201-2202 and internal scan registers (ISR) 2203-2204 of the IC or core have been serially daisy-chained together between TDI/SI and TDO/SO and placed in an STP controlled test mode using a BSR&ISR scan instruction designed for that purpose. Substituting the daisy-chained BSR and ISR scan register of FIG. 22 for the boundary scan register 1901 of FIG. 19A, it should be clear from the previous instruction control descriptions how the BSR&ISR scan instruction may be loaded into the TAP's instruction register to configure the TAP/STP interface into the configuration shown in FIG. 22.

During test, a tester coupled to the TAP/STP interface repetitively executes STP controlled scan cycles on the FIG. 22 daisy-chained BSR&ISR scan register to test the combinational logic circuits 2205-2207 residing between the BSR 2201-2202 and ISR 2203-2204 scan register sections. Each scan cycle includes the shift, update, and capture steps described in the timing diagram of FIG. 20A. Conventional boundary scan cells 2010 of FIG. 20C are used in the BSR and conventional internal scan cells 2011 of FIG. 20C are used in the ISR. During the shift step, scan cells 2010 and 2011 shift data from SI to SO through the daisy-chained BSR& ISR register from TDI/SI to TDO/SO. During the shift step, the FO outputs of scan cells 2010 do not ripple with the SO output because the update FF 2002 maintains the FO output at a constant state during the shift step. However, the FO output of scan cells 2011 do ripple with the SO output. During the update step, the FO output of the scan cells 2010 change as the update FF 2002 is loaded by the UC control signal of FIG. 20A. Prior to the update step, the FO outputs of the scan cells 2011 have already been established by the last shift operation of FIG. 20A. So, from the STP controlled timing diagram of FIG. 20A, it is seen that the FO outputs of the ISR scan cells 2011 are made available immediately after the last shift operation, whereas the availability of the FO outputs of the BSR scan cells 2010 are delayed until the update step, which is one half CK period after the last shift operation. During the capture step, the data on the Fl inputs of BSR scan cells 2010 and ISR scan cell 2011 are loaded into shift FF 2001 and 2003 respectively.

The STP controlled scan test example of FIG. 22 provides a method of allowing both conventional boundary scan cells 2010 and conventional internal scan cells 2011 to be daisy-chained together and operated using the common shift, update, and capture steps shown in the timing diagram of FIG. 20A. Traditionally, it has been necessary to access the BSRs 2201-2202 separately using the TAP controller of FIG. 1A. Also traditionally, it has been necessary to access the ISRs 2202-2203 separately using the STP controlled CS and CK signal sequencing of FIG. 20A. The reason for this is because the boundary scan cells 2010 of the BSR require the update step (i.e. Update-DR state of FIG. 2) between the shift (Shift-DR state of FIG. 2) and capture (Capture-Dr state of FIG. 2)

steps to load data into the update FF 2002. Since internal scan cells 2011 do not have an update FF to load, they only require the shift and capture steps provided by the CS and CK signals of the STP timing diagram of FIG. 20A. Thus the difficulty of daisy-chaining BSRs 2201-2202 and ISRs 2203-2204 together as shown in FIG. 22 and operating the daisy-chained BSR&ISR scan register using either TAP control or STP control has been how to resolve the update step situation. Some known methods for handling the update step in internal scan cells 2011 when using the TAP controller include; (1) gating off the CK input to the internal scan cells 2011 during the update (Update-DR state) step, or (2) using a three input multiplexer in place of the two input multiplexer in internal scan cells 2011 and controlling the third multiplexer input to feed the output of the shift FF 2003 to the input of shift FF 2003 during the update step (Update-DR state), such that the state of the shift FF is maintained during the update step. The drawback of the first method is that it requires inserting gating circuitry in the CK tree wiring, which should be avoided since clock tree routing is critical in an IC or core. The drawback of the second method is that it adds circuitry (three input multiplexer vs two input multiplexer) to each internal scan cell 2011, which should be avoided because it increases test circuit overhead in the IC or core.

To overcome these conventional drawbacks of accessing scan registers which include mixtures of daisy-chained BSR 2201-2202 and ISR 2203-2204 sections, the present disclosure provides and appropriately controls the UC signal of FIG. 20A to perform the update step required for the BSR sections of daisy-chained BSR& ISR scan registers. In FIG. 20A, the CS and CK signal timing for performing the shift and capture steps in internal scan cells 2011 is conventional. However, the generation and positioning of the UC signal between the last shift step and the capture step is new and is what allows the present disclosure to easily operate scan registers which include daisy-chained BSR and ISR sections without incurring the previously mentioned drawbacks. The use of the UC signal is transparent to internal scan cells 2011 since they only have connections to CS and CK. Also, the timing of the UC signal occurs such that it does not effect the conventional timing of the CS and CK signals to the internal scan cells 2011. The timing diagram of FIG. 20A not only transparently provides the BSR required update step, via UC, it does so in a way that supports effective delay testing of combinational logic circuits 2205 and 2207 that reside between BSR and ISR sections of the daisy-chained scan register of FIG. 22. This can be seen in FIG. 20A, where the BSR sections of the FIG. 22 scan register respond to the UC signal to update their FO outputs one half a CK period prior to the capture step that causes the scan cells 2010 and 2011 of the BSR and ISR scan register sections to load data at their Fl inputs. For the same reasons stated for the boundary scan delay test of FIG. 21, the STP controlled delay test of the combinational logic circuits 2205-2207 of FIG. 22 is more effective than a TAP controlled delay test of the same circuits 2205-2207.

FIGS. 9, 11, 13, 15, 17, 18, and 21 of the present disclosure have illustrated the TAP/STP interfaces as always being connected to the scan path 910. While this is one way to connect TAP/STP interfaces, the following description will describe another method of providing access to TAP/STP interfaces. The following connection approach was developed to provide selective access to one or more TAP domains existing within a system IC. The word domain simply indicates the circuitry the TAP provides access to, such as the circuits of FIGS. 1C-1F. In the description below, an overview of the TAP domain access approach will be given, then improvements to the TAP domain access approach will be described to show how it can be used to provide selective access to one or more TAP/STP domains as well. The TAP domain selection approach is the subject of related provisional patent application Ser. No. 60/207,691 filed May 26, 2000, entitled "Improvements In or Related to 1149.1 TAP Linking Modules", which is incorporated herein by reference.

Overview of TAP Domain Access

IEEE 1149.1 TAPs may be utilized at both IC and intellectual property core design levels. TAPs serve as serial communication ports for accessing a variety of embedded circuitry within ICs and cores including; IEEE 1149.1 boundary scan circuitry, built in test circuitry, internal scan circuitry, IEEE 1149.4 mixed signal test circuitry, IEEE P5001 in-circuit emulation circuitry, and IEEE P1532 in-system programming circuitry. Selectable access to TAPs within ICs is desirable since in many instances being able to access only the desired TAP(s) leads to improvements in the way testing, emulation, and programming may be performed within an IC. The following describes how TAP domains embedded within an IC may be selectively accessed using 1149.1 instruction scan operations.

Figure 3B:
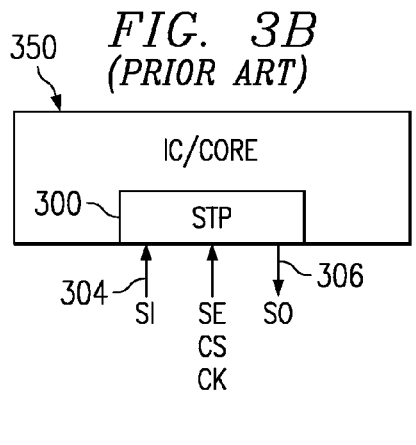
FIG. 3B illustrates an IC or core incorporating the scan test port (STP) of FIG. 3A.
Figure 3C:
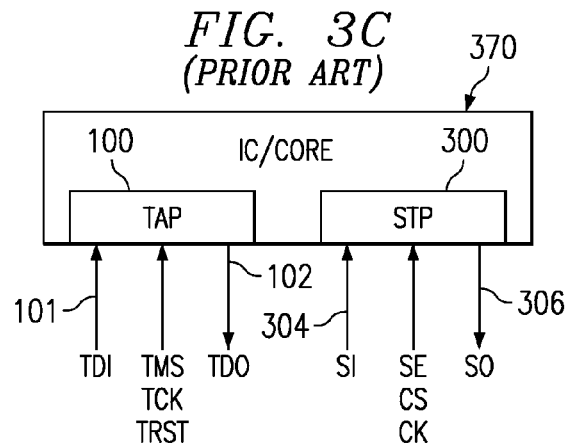
FIG. 3C illustrates an IC or core including both the STP of FIG. 3A and the TAP of FIG. 1A.
Figure 23:
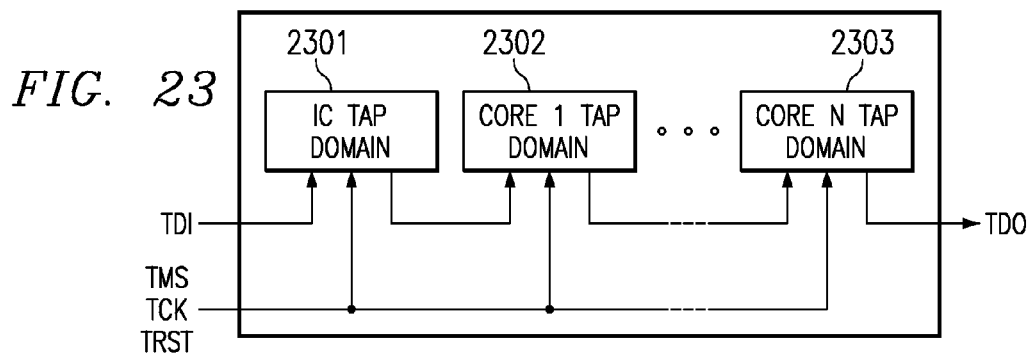
FIG. 23 illustrates an arrangement for connecting multiple TAP domains within an IC to a single scan path.

FIG. 23 illustrates an example arrangement for connecting multiple TAP domains within an IC to a single scan path. Each TAP domain in FIG. 23 is a complete TAP architecture like that shown and described in regard to FIG. 1A. While only one IC TAP domain 2301 exists in an IC, any number of core TAP domains 1-N 2302-2303 may exist within an IC. As seen in FIG. 23, the IC TAP domain and Core 1-N TAP domains are daisy-chained between the IC's TDI and TDO pins. All TAP domains are connected to the IC's TMS, TCK, and TRST signals and operate according to the state diagram of FIG. 2. During instruction scan operations, instructions are shifted into each TAP domain instruction register. One drawback of the TAP domain arrangement of FIG. 3 is that it does not comply with the IEEE 1149.1 standard, since, according to the rules of that standard, only the ICs TAP domain 2301 should be present between TDI and TDO when the IC is initially powered up. A second drawback of the TAP domain arrangement of FIG. 23 is that it may lead to unnecessarily complex access for testing, in-circuit emulation, and/or in-circuit programming functions associated with ones of the individual TAP domains.

For example, if scan testing is required on circuitry associated with the Core 1 TAP domain, each of the scan frames of the test pattern set developed for testing the Core 1 circuitry must be modified from their original form. The modification involves adding leading and trailing bit fields to each scan frame such that the instruction and data registers of the leading and trailing TAP domains become an integral part of the test pattern set of Core 1. Serial patterns developed for in-circuit emulation and/or in-circuit programming of circuitry associated with the TAP domain of Core 1 must be similarly modified. To overcome these and other drawbacks of the TAP arrangement of FIG. 23, the TAP selection architecture described below is provided.

Figure 24:
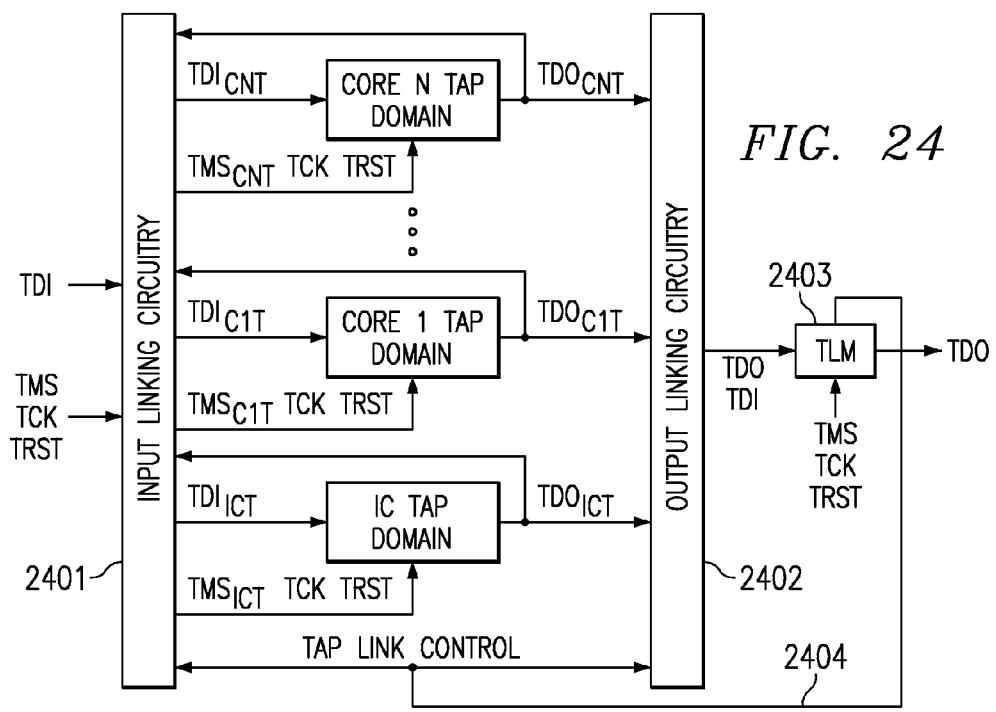
FIG. 24 illustrates a structure for connecting multiple TAP domains within an IC.

FIG. 24 illustrates the preferred structure for connecting multiple TAP domains within an IC according to provisional patent application Ser. No. 60/207,691 filed May 26, 2000, entitled "Improvements In or Related to 1149.1 TAP Linking Modules". The structure includes input and output linking circuitry 2401 and 2402 for connecting one or more TAP domains to the ICs TDI, TDO, TMS, TCK and TRST pins, and a TAP Linking Module (TLM) circuit 2403 for providing the control to operate the input and output linking circuitry.

Figure 25:
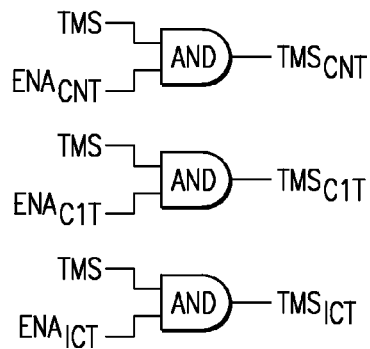
FIG. 25 illustrates circuitry for providing the TMSICT, TMSCIT, and TMSCNT signals in FIG. 24.

The input linking circuitry receives as input; (1) the TDI, TMS, TCK, and TRST IC pins signals, (2) the TDO outputs from the IC TAP (ICT) domain (TDOICT), the Core 1 TAP (CIT) domain (TDOCIT), and the Core N TAP (CNT) domain (TDOCNT), and (3) TAP link control bus 2404 input from the TLM. The TCK and TRST inputs pass unopposed through the input linking circuitry to be input to each TAP domain. The TMS input to the input linking circuitry is gated within the input linking circuitry such that each TAP domain receives a uniquely gated TMS output signal. As seen in FIG. 24, the IC TAP domain receives a gated TMSICT signal, the Core 1 TAP domain receives a gated TMSCIT signal, and the Core N TAP domain receives a gated TMSCNT signal. Example circuitry for providing the gated TMSICT, TMSCIT, and TMSCNT signals is shown in FIG. 25. In FIG. 25, the ENAICT, ENACIT, and ENACNT signals used to gate the TMSICT, TMSCIT, and TMSCNT signals, respectively, come from the TLM via the TAP link control bus.

From FIG. 25 it is seen that TMSCNT can be connected to TMS to enable the Core N TAP domain or be gated low to disable the Core N TAP domain, TMSCIT can be connected to TMS to enable the Core 1 TAP domain or be gated low to disable the Core 1 TAP domain, and TMSICT can be connected to TMS to enable the IC TAP domain or be gated low to disable the IC TAP domain. When a TAP domain TMS input (TMSCNT, TMSCIT, TMSICT) is gated low, the TAP domain is disabled by forcing it to enter the Run Test/Idle state of FIG. 2. A disabled TAP domain will remain in the Run Test/Idle state until it is again enabled by coupling it to the IC's TMS pin input as mentioned above.

Figure 26:
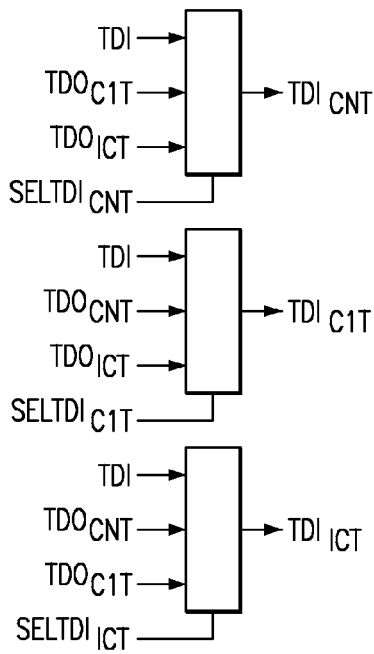
FIG. 26 illustrates circuitry for providing the TDIICT, TDICIT, and TDICNT signals in FIG. 24.

The TDI, TDOCNT, TDOCIT, and TDOICT inputs to the input linking circuitry are multiplexed by circuitry within the input linking circuitry such that each TAP domain receives a uniquely selected TDI input signal. As seen in FIG. 24, the IC TAP domain receives a TDIICT input signal, the Core 1 TAP domain receives a TDICIT input signal, and the Core N TAP domain receives a TDICNT input signal. Example circuitry for providing the TDIICT, TDICIT, and TDICNT input signals is shown in FIG. 26. In FIG. 26, the SELTDIICT, SELTDICIT, and SELTDICNT control signals used to select the source of the TDIICT, TDICIT, and TDICNT input signals, respectively, come from the TLM via the TAP link control bus. From FIG. 26 it is seen that TDICNT can be selectively connected to TDI, TDOCIT, or TDOICT, TDICIT can be selectively connected to TDI, TDOCNT, or TDOICT, and TDIICT can be selectively connected to TDI, TDOCNT, or TDOCIT.

Figure 27:
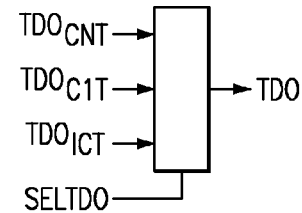
FIG. 27 illustrates circuitry for multiplexing the TDOICT, TDOCIT, and TDOCNT signals in FIG. 24 to the TDO output.

The output linking circuitry receives as input; (1) the TDOCNT output from the Core N TAP domain, the TDOCIT output from the Core 1 TAP domain, the TDOICT output from the IC TAP domain, and TAP link control bus 2404 input from the TLM. As seen in FIG. 24, the output linking circuitry outputs a selected one of the TDOCNT, TDOCIT, and TDOICT input signals to the TLM via the output linking circuitry TDO output. Example circuitry for providing the multiplexing of the TDOICT, TDOCIT, and TDOCNT signals to the TDO output is shown in FIG. 27. In FIG. 27, the SELTDO control input used to switch the TDOICT, TDOCLT, or TDOCNT signals to TDO come from the TLM via the TAP link control bus. From FIG. 27 it is seen that any one of the TDOCNT, TDOCIT, and TDOICT signals can be selected as the input source to the TLM.

The TLM circuit receives as input the TDO output from the output linking circuitry and the TMS, TCK, and TRST IC input pin signals. The TLM circuit outputs to the IC's TDO output pin. From inspection, it is seen that the TLM lies in series with the one or more TAP domains selected by the input and output linking circuitry.

As described above, the TLM's TAP link control bus 2404 is used to control the input and output connection circuitry to form desired connections to one or more TAP domains so that the one or more TAP domains may be accessed via the IC's TDI, TDO, TMS, TCK, and TRST pins. The TAP link control bus signals are output from the TLM during the Update-IR state of the TAP controller state diagram of FIG. 2.

Figure 28A:
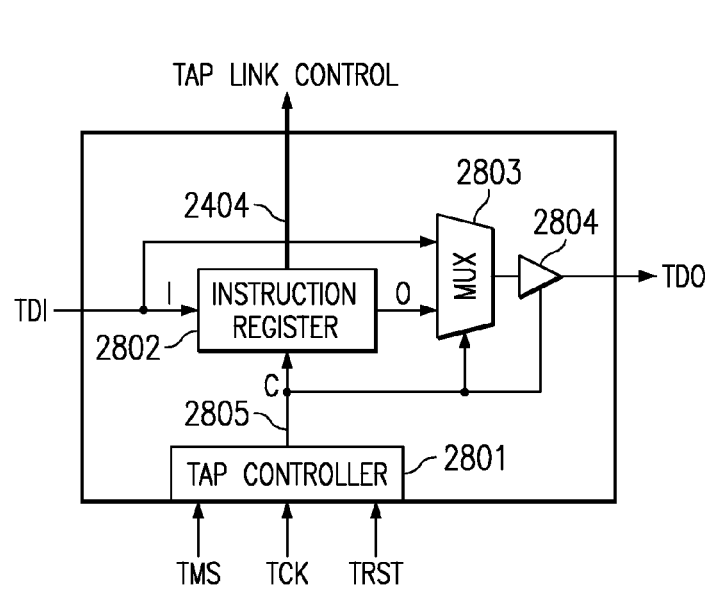
FIG. 28A illustrates the structure of the TLM of FIG. 24.

FIG. 28A illustrates in detail the structure of the TLM. The TLM consists of a TAP controller 2801, instruction register 2802, multiplexer 2803, and 3-state TDO output buffer 2804. The TAP controller is connected to the TMS, TCK and TRST signals. The TDI input is connected to the serial input (I) of the instruction register and to a first input of the multiplexer. The serial output (O) of the instruction register is connected to the second input of the multiplexer. The parallel output of the instruction register is connected to the TAP link control bus 2404 of FIG. 24. The output of the multiplexer is connected to the input of the 3-state buffer 2804. The output of the 3-state buffer is connected to the IC TDO output pin. The TAP controller outputs control (C) to the instruction register, multiplexer, and 3-state TDO output buffer via bus 2805. The TAP controller responds to TMS and TCK input as previously described in regard to FIGS. 1A and 2. During instruction scan operations, the TAP controller enables the 3-state TDO buffer and shifts data through the instruction register from TDI to TDO. During data scan operations, the TAP controller enables the 3-state TDO buffer and forms a connection, via multiplexer 2803, between TDI and TDO.

Figure 28B:
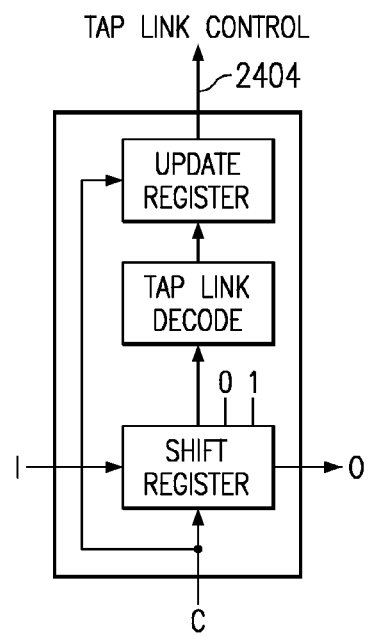
FIG. 28B illustrates the structure of instruction register of FIG. 28A.

FIG. 28B illustrates the instruction register 2802 in more detail. The instruction register consists of a shift register, TAP link decode logic, and update register. The shift register has the serial input (I), serial output (O), control (C) inputs shown in FIG. 28A, parallel outputs to the TAP link decode logic, and parallel inputs for loading fixed logic 0 and 1 settings. The fixed logic 0 and 1 inputs are provided for capturing logic 0 and 1 data bits into the first two instruction shift register bit positions closest to TDO, which is a requirement for IEEE 1149.1 compliant instruction shift registers. The parallel output from the instruction register is input to TAP link decode logic. The parallel output from the TAP link decode logic is input to the update register. The parallel output of the update register is connected to the TAP link control bus 2402 to provide control input to the input and output linking circuitry 2401 and 2402 of FIG. 24. During the Capture-IR state of FIG. 2, the shift register captures data (0 & 1) on the parallel input. During the Shift-IR state of FIG. 2, the shift register shifts data from TDI (I) to TDO (O). During the Update-IR state of FIG. 2, the update register loads the decoded instruction control input from the TAP link decode logic and outputs the decoded instruction control onto the TAP link control bus 2404.

Figure 29:
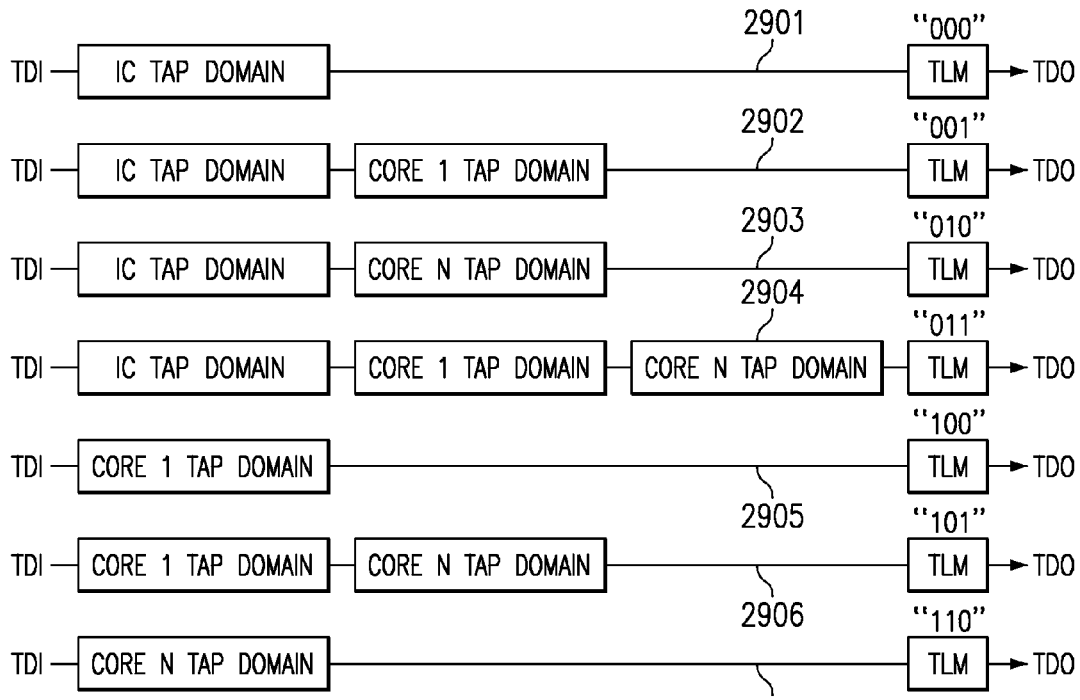
FIG. 29 illustrates various arrangements of TAP domain connections during 1149.1 instruction scan operations.

FIG. 29 illustrates various possible arrangements 2901-2907 of TAP domain connections during 1149.1 instruction scan operations. Since during instruction scan operations, the TLM's instruction register is physically present and in series with the connected TAP domain(s) instruction register(s), the instruction scan frame for each arrangement will be augmented to include the TLM's instruction register bits. It is assumed at this point that the TLM's instruction shift register of FIG. 28 is 3 bits long and that the 3 bit instructions have been decoded by the TLM's instruction register to uniquely select a different TAP domain connection arrangement between the ICs TDI and TDO pins. For example and as indicated in FIG. 29, shifting in the following 3 bit TLM instructions and updating them from the TLM to be input to the input and output linking circuitry will cause the following TAP domain connections to be formed.

As seen in arrangement 2901, a "000" instruction shifted into and updated from the TLM instruction register will cause the IC TAP domain to be enabled and connected in series with the TLM between the TDI and TDO IC pins.

As seen in arrangement 2902, a "001" instruction shifted into and updated from the TLM instruction register will cause the IC TAP domain and the Core 1 TAP Domain to be enabled and connected in series with the TLM between the TDI and TDO IC pins.

As seen in arrangement 2903, a "010" instruction shifted into and updated from the TLM instruction register will cause the IC TAP domain and the Core N TAP Domain to be enabled and connected in series with the TLM between the TDI and TDO IC pins.

As seen in arrangement 2904, a "111" instruction shifted into and updated from the TLM instruction register will cause the IC TAP domain, the Core 1 TAP Domain, and the Core N TAP domain to be enabled and connected in series with the TLM between the TDI and TDO IC pins.

As seen in arrangement 2905, a "100" instruction shifted into and updated from the TLM instruction register will cause the Core 1 TAP Domain to be enabled and connected in series with the TLM between the TDI and TDO IC pins.

As seen in arrangement 2906, a "101" instruction shifted into and updated from the TLM instruction register will cause the Core 1 TAP Domain and Core N TAP domain to be enabled and connected in series with the TLM between the TDI and TDO IC pins.

As seen in arrangement 2907, a "110" instruction shifted into and updated from the TLM instruction register will cause the Core N TAP Domain to be enabled and connected in series with the TLM between the TDI and TDO IC pins.

At power up of the IC, the TLM 3-bit instruction shall be initialized to "000" to allow only the IC TAP domain arrangement 2901 to be enabled and coupled between TDI and TDO. This complies with the IC power up requirement established in the IEEE 1149.1 standard. Following power up, an instruction scan operation can be performed to shift instruction data through the IC TAP domain and the serially connected TLM to load a new IC TAP domain instruction and to load a new 3 bit instruction into the TLM. If the power up IC TAP domain arrangement 2901 is to remain in effect between TDI and TDO, the 3 bit "000" TLM instruction of FIG. 29 will be re-loaded into the TLM instruction register during the above mentioned instruction scan operation. However, if a new TAP domain arrangement is to desired between TDI and TDO, a different 3 bit TLM instruction will be loaded into the TLM instruction register during the above mentioned instruction register scan operation.

From the description given above, it is clear that a different TAP domain arrangement may be selected by the TLM's instruction register following each 1149.1 instruction scan operation, more specifically during the Update-IR state (FIG. 2) of each instruction scan operation. Thus the TAP domain selection process comprises only the single step of performing an instruction scan operation to load instructions into the instruction registers of the currently selected TAP domains and TLM.

The following briefly re-visits and summarizes the operation of the TLM and input and output linking circuitry to clarify the TAP domain arrangement switching illustrated in FIG. 29. As previously described in regard to FIG. 24, the TMS inputs of enabled TAP domains are coupled to the IC's TMS input pin (via the gating circuitry of FIG. 25), while the TMS inputs of disabled TAP domains are gated to a logic low (via the gating circuitry of FIG. 25). Also, enabled TAP domains are serially connected (via the multiplexers of FIGS. 26 and 27) to form the desired serial TAP domain connection between the IC's TDI and TDO pins, the connection including the TLM. All the control for enabling or disabling the TAP domain TMS inputs and for forming serial TAP domain connections between the IC's TDI and TDO pins comes from the TLM's TAP link control bus. The control output from the TAP link control bus changes state during the Update-IR state of the TAP state diagram of FIG. 2. So, all TAP domain connection arrangement changes take place during the Update-IR state.

Figure 30:
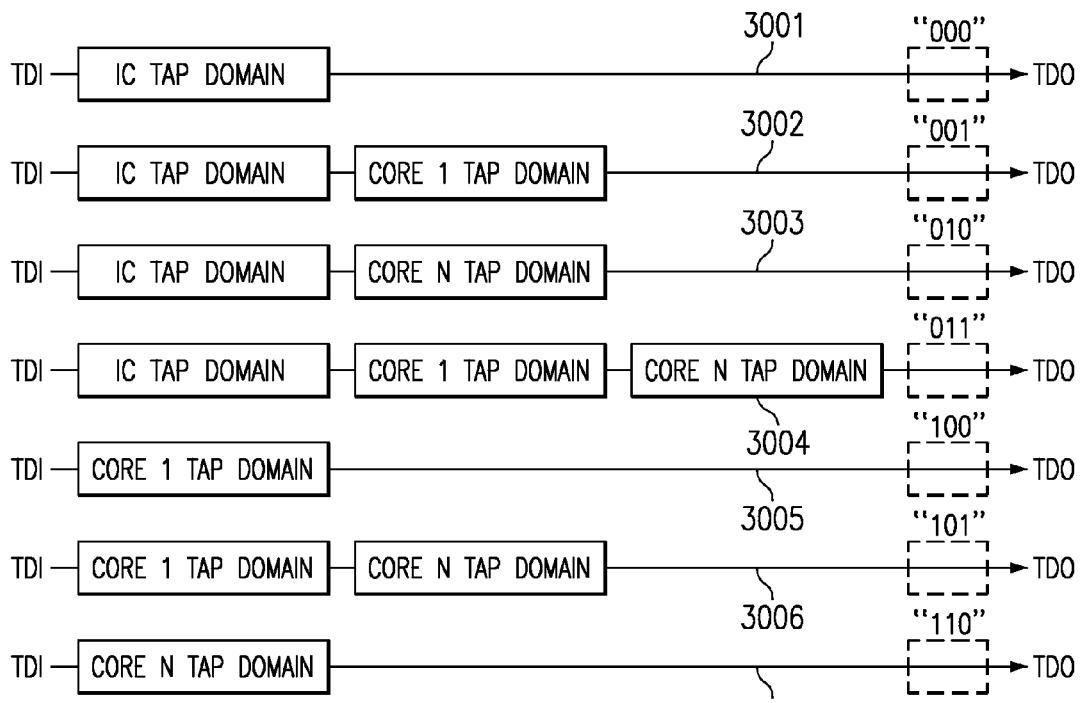
FIG. 30 illustrates that during 1149.1 data scan operations the TLM 2403 of FIG. 24 is configured to simply form a connection path between the output of the selected TAP domain arrangement and the IC's TDO pin.

FIG. 30 is provided to illustrate that during 1149.1 data scan operations the TLM 2403 is configured, as described in regard to FIG. 28, to simply form a connection path between the output of the selected TAP domain arrangement 3001-3007 and the IC's TDO pin. Thus the TLM 2403 does not add bits to 1149.1 data scan operations as it does for 1149.1 instruction scan operations. TAP domain arrangements 3001-3007 for 1149.1 data scans are the same as TAP domain arrangements 2901-2907 for 1149.1 instruction scans, with the exception that during data scans the output of the selected TAP domain arrangement 3001-3007 passes directly through the TLM to TDO, as opposed to passing through the TLM's instruction register during instruction scans to TAP domain arrangements 2901-2907.

Figure 31:
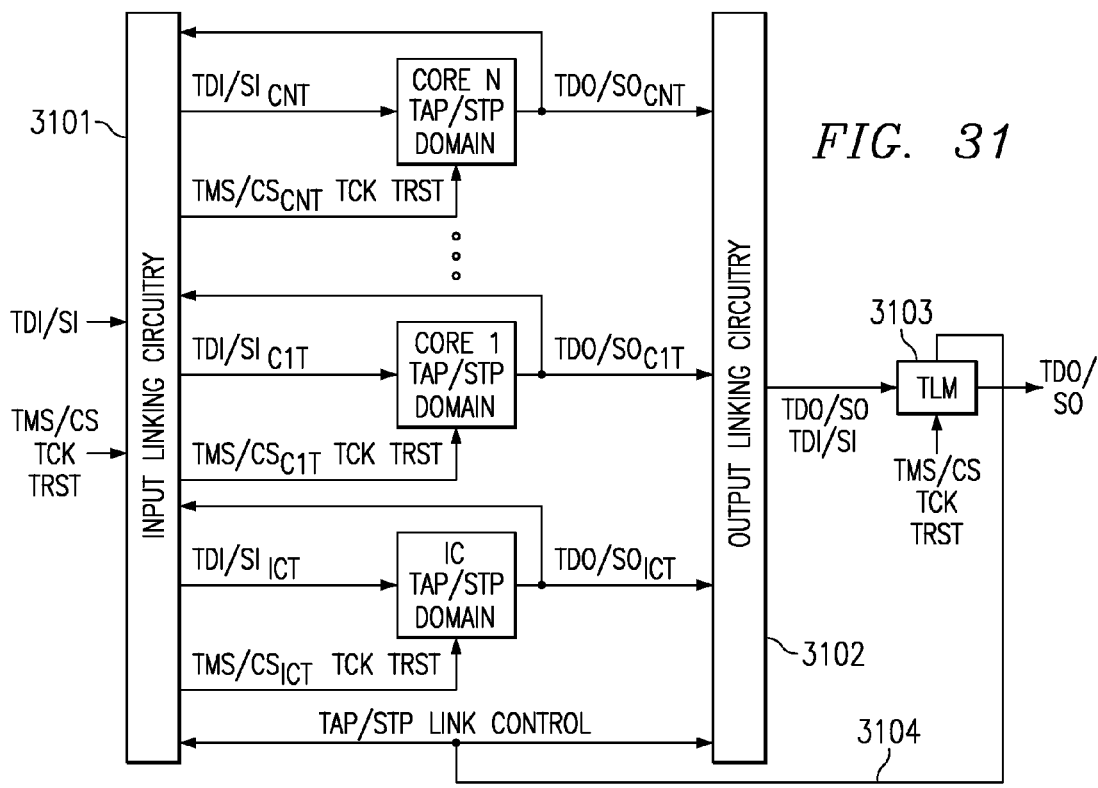
FIG. 31 illustrates how the structure of the TLM architecture of FIG. 24 may be adapted to support TAP/STP domains instead of TAP domains.

FIG. 31 illustrates how the structure of the TLM architecture of FIG. 24 may be adapted to support TAP/STP domains instead of TAP domains. From FIG. 31 it is seen that the basic structure of the TLM architecture of FIG. 24 is maintained when using TAP/STP domains in place of TAP domains. The changes seen in FIG. 31 involve renaming TDI to TDI/SI, TDO to TDO/SO, TMS to TMS/CS, TDICNT to TDI/SICNT, TDICIT to TDI/SICIT, TDIICT to TDI/SIICT, TMSCNT to TMS/CSCNT, TMSCIT to TMS/CSCIT, TMSICT to TMS/CSICT, TDOCNT to TDO/SOCNT, TDOCIT to TDO/SOCIT, and TDOICT to TDO/SOICT, to represent the different signal types used by the TAP/STP domains. The name of the TAP link control bus of FIG. 24 has also been changed to TAP/STP link control bus 3104 in FIG. 31.

Figure 32:
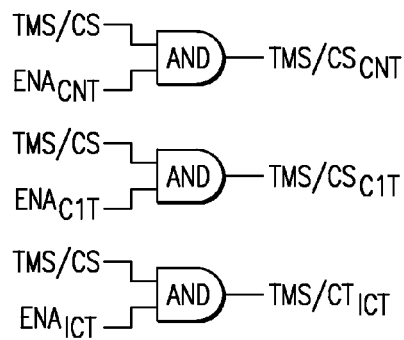
FIGS. 32 and 33 represent the TAP/STP domain signal name substitution for the TAP domain signal names in the TMS gating circuitry and TDI multiplexing circuitry of the input circuitry of FIG. 31.
Figure 33:
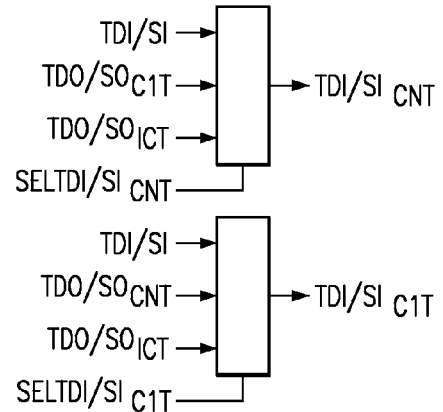
Figure 34:
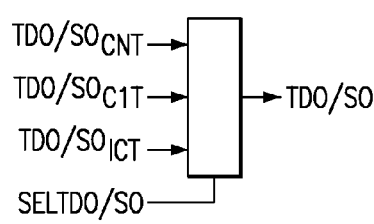
FIG. 34 represents the TAP/STP domain signal name substitution for the TAP domain signal names of the output circuitry of FIG. 31.

FIGS. 32 and 33 represent the TAP/STP domain signal name substitution for the TAP domain signal names in the TMS gating circuitry and TDI multiplexing circuitry of the input circuitry 3101 of FIG. 31. The control inputs to the TDI/SI multiplexer circuitry of FIG. 33, from the TAP/STP link control bus of FIG. 31, are also changed from SELTDICNT to SELTDI/SICNT, SELTDICIT to SELTDI/SICIT, and SELTDIICT to SELTDI/SIICT. FIG. 34 represents the TAP/STP domain signal name substitution for the TAP domain signal names of the output circuitry 3102 of FIG. 31. The gating and multiplexing circuitry of FIGS. 32-34 respond to TLM 3103 instruction control output on TAP/STP control bus 3104 as previously mentioned. The only circuit changes between the TLM architecture of FIGS. 24 and 31, excluding the substitution of TAP/STP domains for TAP domains and the signal renaming mentioned above lies within TLM 3103 as describe below.

It should be clear that the TMS/CSCNT, TMS/CSCIT, TMS/CSICT outputs of the AND gates in FIG. 32 are each input to a respective AND gate 503 (FIG. 7) of the Core N, Core 1, and IC TAP/STP interfaces of FIG. 31. From this, it should clear that a three input AND gate 503 (FIG. 7) could be substituted for the two input AND gate 503 to allow the third input to directly input the ENACNT, ENACIT, and ENAICT signals from the TLM 3103. This would eliminate the need for the AND gates of FIG. 32 and reduce the signal propagation delay of the TMS/CS input to the TAP controller of the TAP/STP interfaces.

Figure 35A:
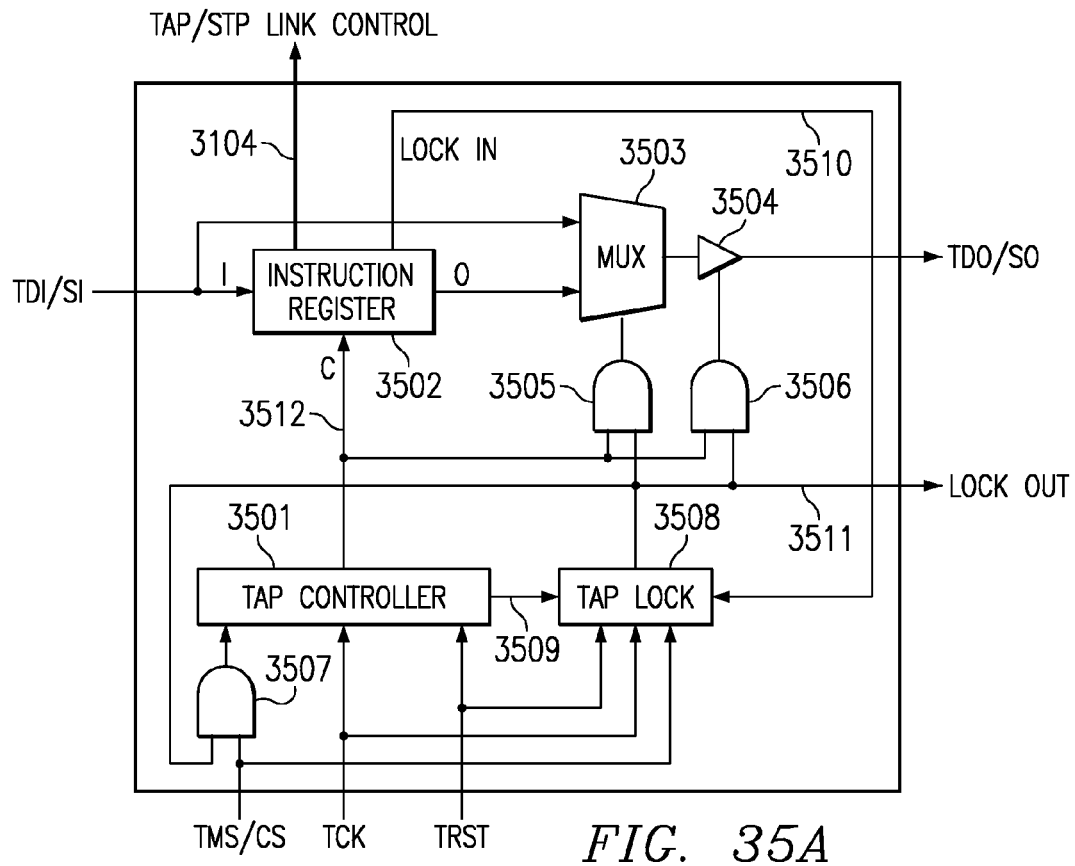
FIG. 35A illustrates the TLM of FIG. 31.

FIG. 35A illustrates a detail view of TLM 3103 of FIG. 31. Like TLM 2403 of FIG. 28, TLM 3103 contains a TAP controller 3501, instruction register 3502, multiplexer 3503, and 3-state buffer 3504. Unlike TLM 2403, TLM 3103 additionally contains logic gates 3505, 3506, 3507, and a TAP lock circuit 3508. The TAP controller outputs the Update-IR signal 3509 to TAP lock circuit 3508, as described in regard to FIG. 7. The instruction register 3502 outputs the Lock in signal 3510 to the TAP lock circuit, as described in FIG. 7. The TAP lock circuit outputs the Lock out signal 3511 from the TLM and to gates 3505, 3506, and 3507. Gate 3507 serves the same function as gate 503 of FIG. 7, that being gating the TMS input to the TAP controller 3501 on when Lock out is high and off when Lock out is low. When Lock out is high (TAP unlocked), gates 3505 and 3506 pass signals from the TAP controller bus 3512 to operate multiplexer 3503 and 3-state buffer 3504, during TAP controller instruction and data scan operations as previously described with TLM 2403 of FIG. 28. When Lock out is low (TAP is Locked), the output of gate 3505 is set, via the Lock out signal, to select the TDI/SI input to multiplexer 3503 to be input to buffer 3504. Also while Lock out is low, the output of gate 3506 is set, via the Lock out signal, to enable the output of buffer 3504 to drive TDO/SO.

The TAP lock process of; (1) inputting an instruction into the instruction register of TLM 3103 to set the Lock in signal 3510 high, (2) clocking the Lock in signal into the TAP lock circuit 3508 to set the Lock out signal 3511 low, and (3) disabling the TAP controller 3501 and enabling the TAP Lock circuit 3508 in response to the Lock out signal going low, is the same as described previously in regard to FIGS. 7, 8A and 8B. While the TAP controller 3501 is locked and the TAP Lock circuit 3508 is enabled, STP control of TMS/CS can occur as described in regard to FIGS. 7, 8A, and 8B without unlocking the TAP controller 3501 and without disabling the TAP Lock circuit 3508. The process of unlocking the TAP controller 3501 and disabling the TAP Lock circuit 3508 by setting the TMS/CS input to the TAP Lock circuit 3508 low for a required number of TCK inputs is also the same as previously described in regard to the TAP lock circuit descriptions of FIGS. 8A and 8B.

Figure 35B:
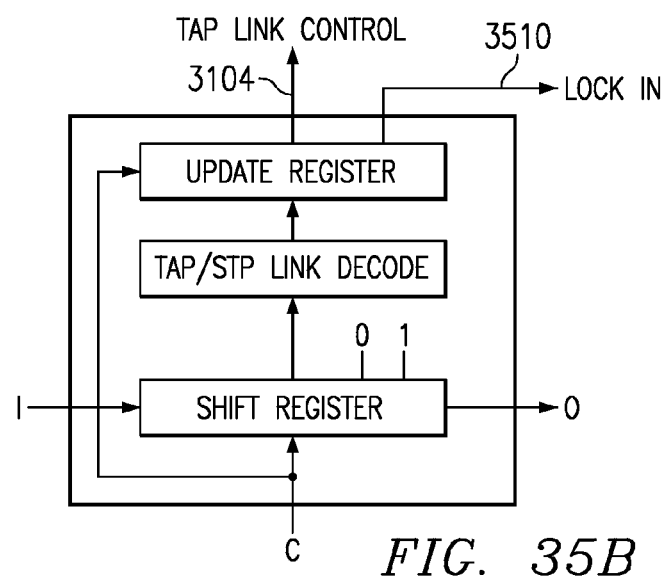
FIG. 35B illustrates the instruction register of FIG. 35A.

FIG. 35B illustrates in detail the changes required to instruction register 3502 to enable TLM 3103 to operate in a first mode to select and access TAP/STP domains using TAP control, or operate in a second mode to select and access TAP/STP domains using STP control. Instruction register 3502 is similar in structure and operation to instruction register 2802 in that it has a shift register, a TAP/STP link decode logic, and an update register. The differences between instruction registers 3502 and 2802 include; (1) the shift register of 3502 is 4 bits long instead of 3 bits in 2802, (2) the TAP/STP link decode logic of 3502 is designed to decode the 4 bit instruction instead of the 3 bit instruction of 2802, and (3) the update register of 3502 includes, in addition to the TAP/STP link control bus 3104, an output for the Lock in signal 3510.

Figure 36:
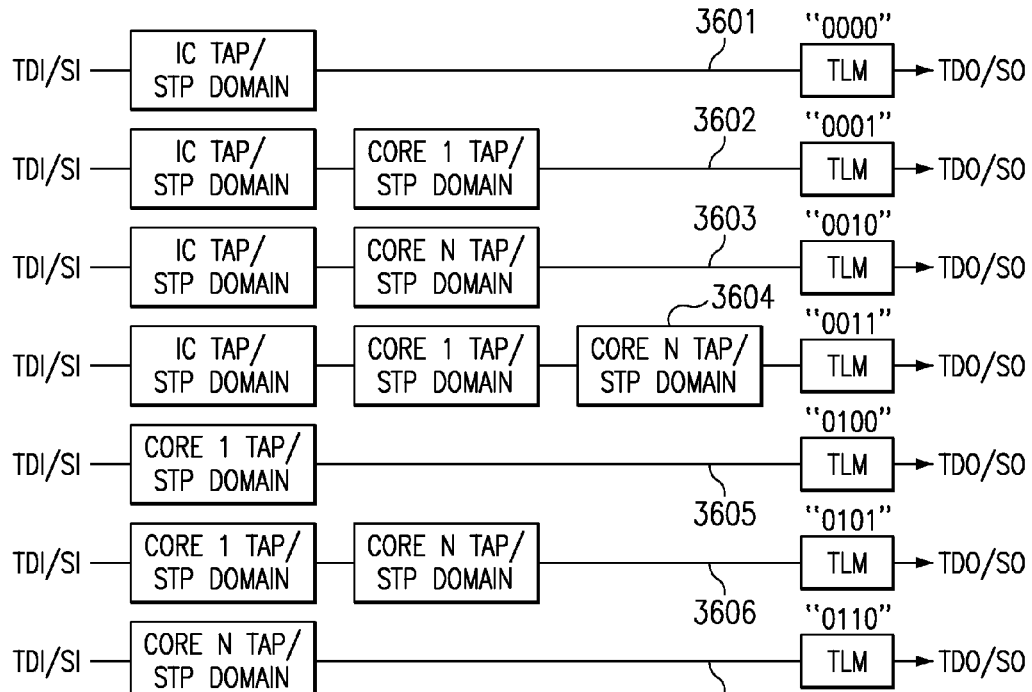
FIG. 36 illustrates various arrangements of TAP/STP domain connections during 1149.1 TAP instruction scan operations using the TAP/STP architecture of FIG. 31.

FIG. 36 illustrates various possible arrangements 3601-3607 of TAP/STP domain connections during 1149.1 TAP instruction scan operations using the TAP/STP architecture of FIG. 31. Since during instruction scan operations, the TLM's 3103 instruction register is physically present and in series with the connected TAP/STP domain(s) instruction register(s), the instruction scan frame for each arrangement will be augmented to include the TLM's 3103 4 instruction register bits. As previously mentioned, the TLM's 3103 instruction shift register of FIG. 35B is 4 bits long and the 4 bit instructions have been decoded by the TLM's 3103 instruction register to uniquely select a different TAP/STP domain connection arrangement between the ICs TDI/SI and TDO/SO pins. For example and as indicated in FIG. 36, shifting in the following 4 bit TLM instructions and updating them from TLM 3103 to the input and output linking circuitry 3101 and 3102 will cause the following TAP/STP domain connections to be formed.

As seen in arrangement 3601, a "0000" instruction shifted into and updated from the TLM instruction register will cause the IC TAP/STP domain to be enabled and connected in series with the TLM between the TDI/SI and TDO/SO IC pins.

As seen in arrangement 3602, a "0001" instruction shifted into and updated from the TLM instruction register will cause the IC and Core 1 TAP/STP domains to be enabled and connected in series with the TLM between the TDI/SI and TDO/SO IC pins.

As seen in arrangement 3603, a "0010" instruction shifted into and updated from the TLM instruction register will cause the IC and Core N TAP/STP domains to be enabled and connected in series with the TLM between the TDI/SI and TDO/SO IC pins.

As seen in arrangement 3604, a "0011" instruction shifted into and updated from the TLM instruction register will cause the IC, Core 1, and Core N TAP/STP domains to be enabled and connected in series with the TLM between the TDI/SI and TDO/SO IC pins.

As seen in arrangement 3605, a "0100" instruction shifted into and updated from the TLM instruction register will cause the Core 1 TAP/STP domain to be enabled and connected in series with the TLM between the TDI/SI and TDO/SO IC pins.

As seen in arrangement 3606, a "0101" instruction shifted into and updated from the TLM instruction register will cause the Core 1 and Core N TAP/STP domains to be enabled and connected in series with the TLM between the TDI/SI and TDO/SO IC pins.

As seen in arrangement 3607, a "0110" instruction shifted into and updated from the TLM instruction register will cause the Core N TAP/STP domain to be enabled and connected in series with the TLM between the TDI/SI and TDO/SO IC pins.

At power up of the IC, the TLM 3103 4-bit instruction is initialized to "0000" to allow only the IC TAP/STP domain arrangement 3601 to be enabled and coupled between TDI/SI and TDO/SO, to comply with the EEE 1149.1 standard. Following power up, an instruction scan operation can be performed to shift instruction data through the IC TAP domain and the serially connected TLM 3103 to load a new IC TAP/STP domain instruction and to load a new 4 bit instruction into the TLM.

From the description given above, it is clear that a different TAP/STP domain arrangement may be selected by the TLM 3103 instruction register following each 1149.1 instruction scan operation, more specifically during the Update-IR state (FIG. 2) of each instruction scan operation. Thus the TAP/STP domain selection process comprises only the single step of performing an instruction scan operation to load instructions into the instruction registers of the currently selected TAP/STP domains and TLM 3103.

Figure 37:
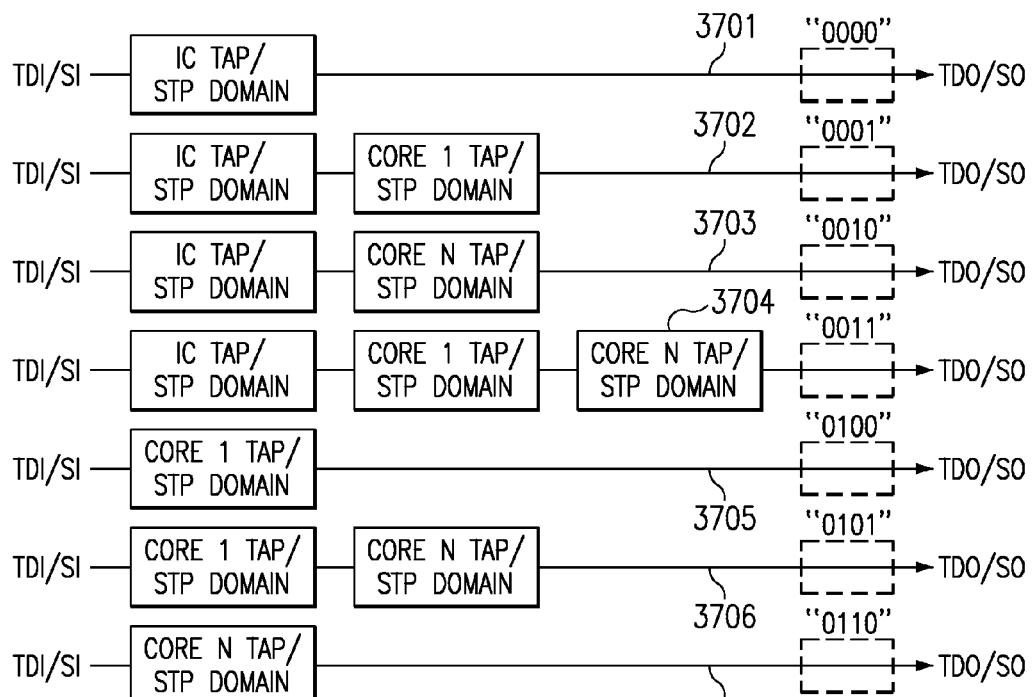
FIGS. 37 and 38 illustrate that during 1149.1 data scan operations the TLM 3103 is configured to form a connection path between the output of the selected TAP/STP domain arrangement and the IC's TDO/SO pin.

FIG. 37 is provided to illustrate that during 1149.1 data scan operations the TLM 3103 is configured, as described in regard to FIG. 35A, to simply form a connection path between the output of the selected TAP/STP domain arrangement 3701-3707 and the IC's TDO/SO pin. Thus the TLM 3103 does not add bits to 1149.1 data scan operations as it does for 1149.1 instruction scan operations. TAP/STP domain arrangements 3701-3707 for 1149.1 data scans are the same as TAP/STP domain arrangements 3601-3607 for 1149.1 instruction scans, with the exception that during data scans the output of the selected TAP/STP domain arrangement 3701-3707 passes directly through the TLM to TDO/SO, as opposed to passing through the TLM's instruction register during instruction scans to TAP/STP domain arrangements 3001-3007.

Comparing the operation of the TAP controlled instruction and data scan operations of FIGS. 36 and 37 to the TAP controlled instruction and data scan operations of FIGS. 29 and 30, it is clear that the TLM architectures of FIG. 31 (using TAP/STP domains) and FIG. 24 (using TAP domains) are similar. This is because in both TLM architectures of FIGS. 31 and 24, the selected TAP or TAP/STP domains are receptive to being accessed using IEEE 1149.1 TAP controlled instruction (FIGS. 36 and 29) and data (FIGS. 37 and 30) scan operations.

The process of selecting a TAP/STP domain arrangement of FIG. 31, placing the selected TAP/STP domain arrangement in the STP controlled mode, and accessing the selected TAP/STP domain arrangement using STP control is as follows. This process example will start in TAP/STP domain arrangement 3601 of FIG. 36, then switch to TAP/STP domain arrangement 3604 of FIG. 36, then switch the TAP/STP interfaces of the TAP/STP domain arrangement 3604 from TAP control to STP control.

Figure 38:
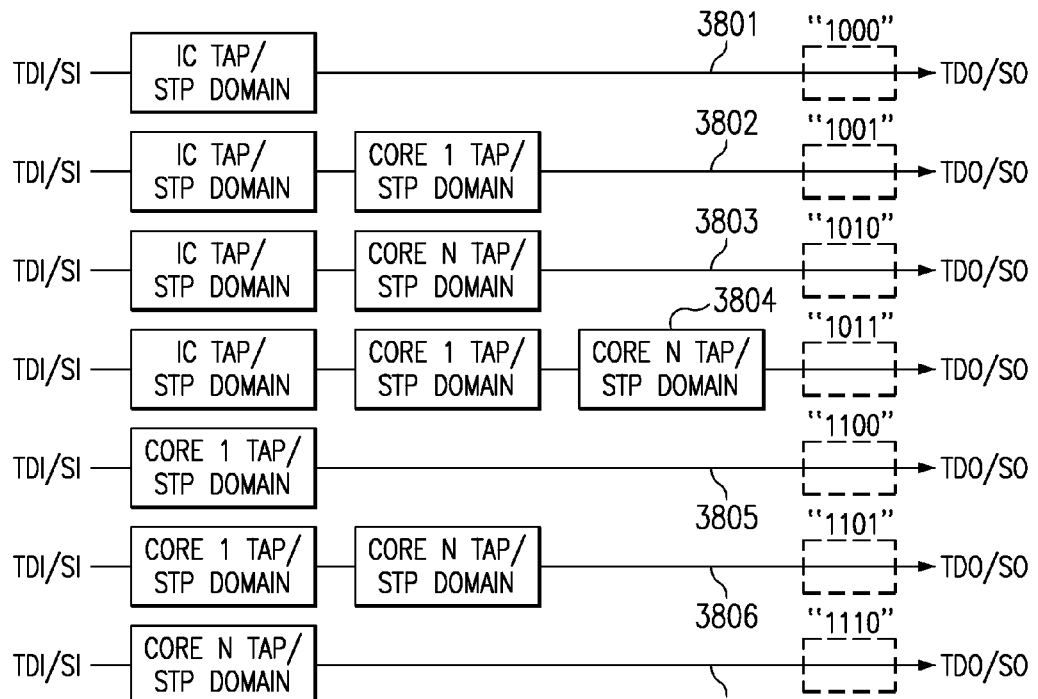

A first TAP controlled instruction scan is performed on TAP/STP domain arrangement 3601 to load instructions into the IC TAP/STP domain and the TLM 3103. The instruction loaded into the TLM is "0011" and the instruction loaded into the IC TAP/STP is say an IEEE 1149.1 standard bypass instruction, a well known 1149.1 instruction. In response to the "0011" TLM instruction, the TLM architecture of FIG. 31 switches from selecting the TAP/STP domain arrangement 3601 between TDI/SI and TDO/SO to selecting TAP/STP domain arrangement 3604 between TDI/SI and TDO/SO, as previously described. A second TAP controlled instruction scan is performed through the IC, Core 1, and Core N TAP/STP domains and TLM of arrangement 3604. This second instruction scan loads an STP controlled test instruction, like the previously described STP controlled scan test instruction of FIGS. 5-9, into the IC, Core 1, and Core N TAP/STP interfaces and also loads the TLM with a "1011" instruction which will bring about the STP controlled TAP/STP domain arrangement 3804 seen in FIG. 38. In response to the second instruction scan, the IC, Core 1, and Core N TAP/STP interfaces switch from TAP control to STP control for performing the STP controlled the scan test instructions, as described in regard to the daisy-chained cores 1-N of FIG. 9. Also in response to the second instruction scan, the "1011" instruction loaded into the TLM 3103 instruction register causes the TLM to switched from TAP control to STP control.

The switching of the TLM 3103 from TAP to STP control can best be understood by inspection of FIGS. 35A and 35B. When the "1011" instruction is updated from the TLM instruction register, the Lock in output 3510 from the TLM instruction register goes high. The high on Lock in 3510 is input to TAP lock circuit 3508. In response to the high on Lock in 3510 and when the TAP lock circuit 3508 receives the Update-IR clock 3509 from TAP controller 3501, the TAP lock circuit is enabled and drives its Lock out signal 3511 low. The low on Lock out 3511 disables TAP controller 3501, forms a connection from TDI/SI through multiplexer 3503 to the input of 3-state buffer 3504, and enables the output of 3-state buffer 3504 to drive out on TDO/SO, as previously described using gates 3505-3507. Once placed in the STP controlled mode, TLM 3103 will remain in the STP controlled mode until the previously described TMS/CS escape sequence is input to the TAP lock circuit's unlock state machine as described in regard to FIGS. 8A and 8B.

While in the STP controlled TAP/STP domain arrangement 3804, scan testing of IC, Core 1 and Core N occurs as described previously in regard to the cores 1-N of FIG. 9. In the TAP/STP domain arrangement 3804, as in the TAP domain arrangement 3704, the TLM 3103 does not add bits to the scan patterns shifted through the IC, Core 1 and Core N during the STP controlled scan test operations. At the end of the STP controlled scan test operation to TAP/STP domain arrangement 3804, the TMS/CS is set low to cause the IC, Core 1, Core 2, and TLM to switch from the STP controlled mode to the TAP controlled mode, as previously described in FIGS. 8A and 8*b*.

After the TAP/STP domain arrangement 3804 returns to the TAP controlled mode, a TAP controlled instruction scan, as described in regard to TAP/STP domain arrangement 3604 is executed to load different instructions into the IC, Core 1, Core N and TLM instruction register. The loaded instructions may select another TAP/STP domain arrangement for testing using either TAP or STP control. In a first example, and in response to the above mentioned TAP controlled instruction scan operation, if the TLM's instruction register were loaded with a "1110" instruction and Core N were loaded with a different type of STP controlled test instruction, the Core N TAP/STP domain arrangement 3807 would be selected between TDI/SI and TDO/SO for testing Core N via STP control of the different test instruction. In a second example, and in response to the above mentioned TAP controlled instruction scan operation, if the TLM's instruction register were loaded with a "0100" instruction and Core 1 were loaded with a different type of TAP controlled test instruction, the Core 1 TAP/STP domain arrangement 3605 would be selected between TDI/SI and TDO/SO for testing Core 1 via TAP control of the different test instruction. In general, any TAP/STP domain arrangement can be selected by the above mentioned TAP instruction scan operation to load instructions into a currently selected TAP/STP domain arrangement and TLM to select a new TAP/STP domain arrangement and initiate either TAP or STP controlled testing on the new TAP/STP domain arrangement.

Figure 1D:
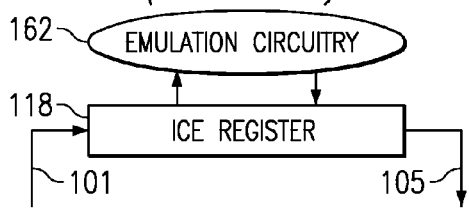
Figure 1E:
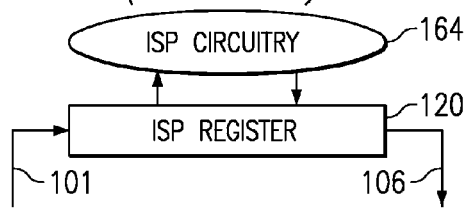

Instructions not related to testing but rather to other embedded functions, such as the in-circuit emulation or in-circuit programming examples of FIGS. 1D and 1E, may be loaded into particular TAP/STP domain arrangements along with a TLM instruction for selecting the particular TAP/STP domain arrangement to allow the other embedded functions to be operated from either TAP or STP control. Furthermore, any type of instruction may be loaded into a TAP/STP domain and executed using TAP or STP control with or without the TLM. For example, a fixed TAP/STP domain arrangement as shown in FIG. 9 could execute test, in-circuit emulation, or in-circuit programming instructions using either TAP or STP control.

Figure 39:
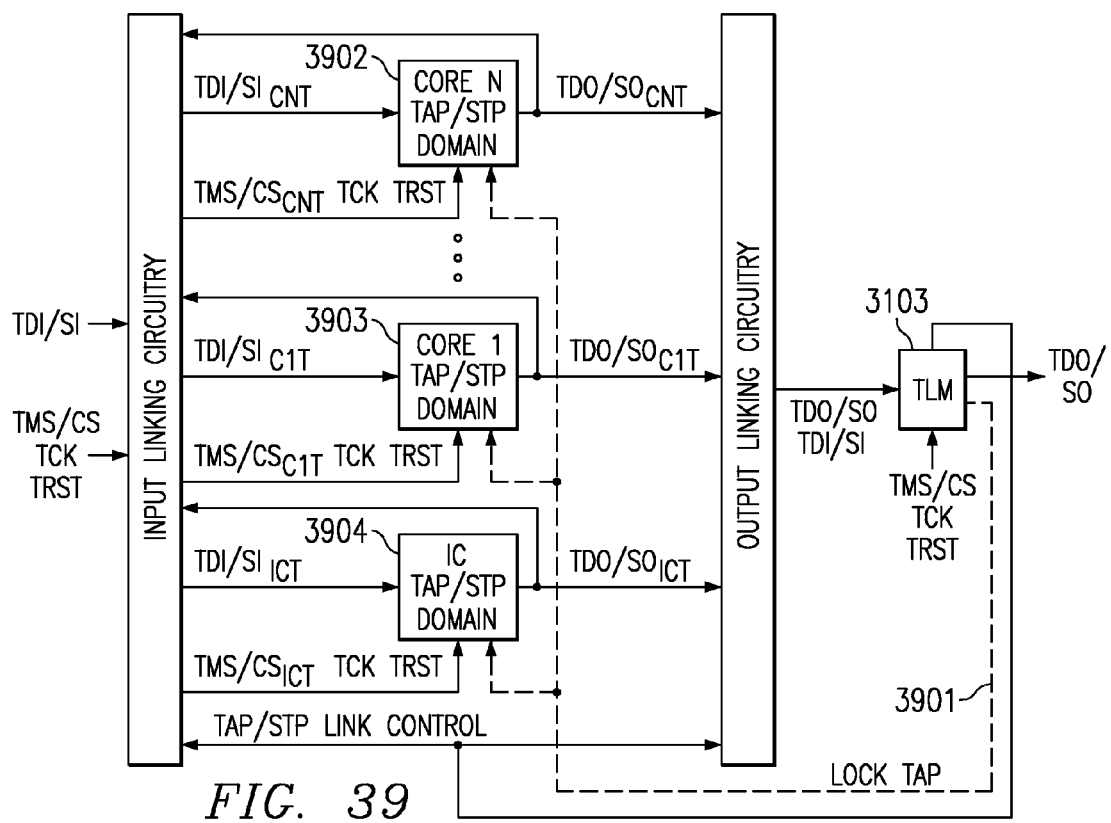
FIGS. 39 and 40 illustrate modified embodiments of the structure of FIG. 31.

In FIG. 39, a dotted line connection 3901 is shown formed between TLM 3103 and IC, Core 1, and Core N TAP/STP domains. This is provided to illustrate another example implementation of the present disclosure whereby the externally available Lock out signal 3511 of the TLM's TAP lock circuit 3508 is used to provide the Lock Out signal to the TAP/STP domains which, in this example, do not themselves have TAP lock circuits. In this example, the TAP/STP domain interfaces are equipped with input terminals 3902-3904 for inputting the Lock Out signal 3511 from TLM 3103 via connection 3901. The TAP/STP domain interfaces of FIG. 39 utilize the FIG. 6 TAP/STP interface style which does not include the TAP lock circuit, but rather inputs the Lock Out signal via an input terminal. The operation of this alternate realization of the present disclosure to switch between TAP and STP controlled modes is the same as previously described. The use of the TLM's TAP lock circuit 3508 to generate the Lock out signal to a plurality of TAP/STP domain interfaces which themselves don't have TAP lock circuits, as shown in FIG. 39, should be understood to be an alternate method of implementing the present disclosure in all TLM examples described herein. In some implementations, the use of the TLM's TAP lock circuit 3508 to generate the Lock out signal to other TAP/STP domain interfaces as shown in FIG. 39 may be preferred since it eliminates the need for each TAP/STP domain interface to have its own TAP lock circuit.

Figure 40:
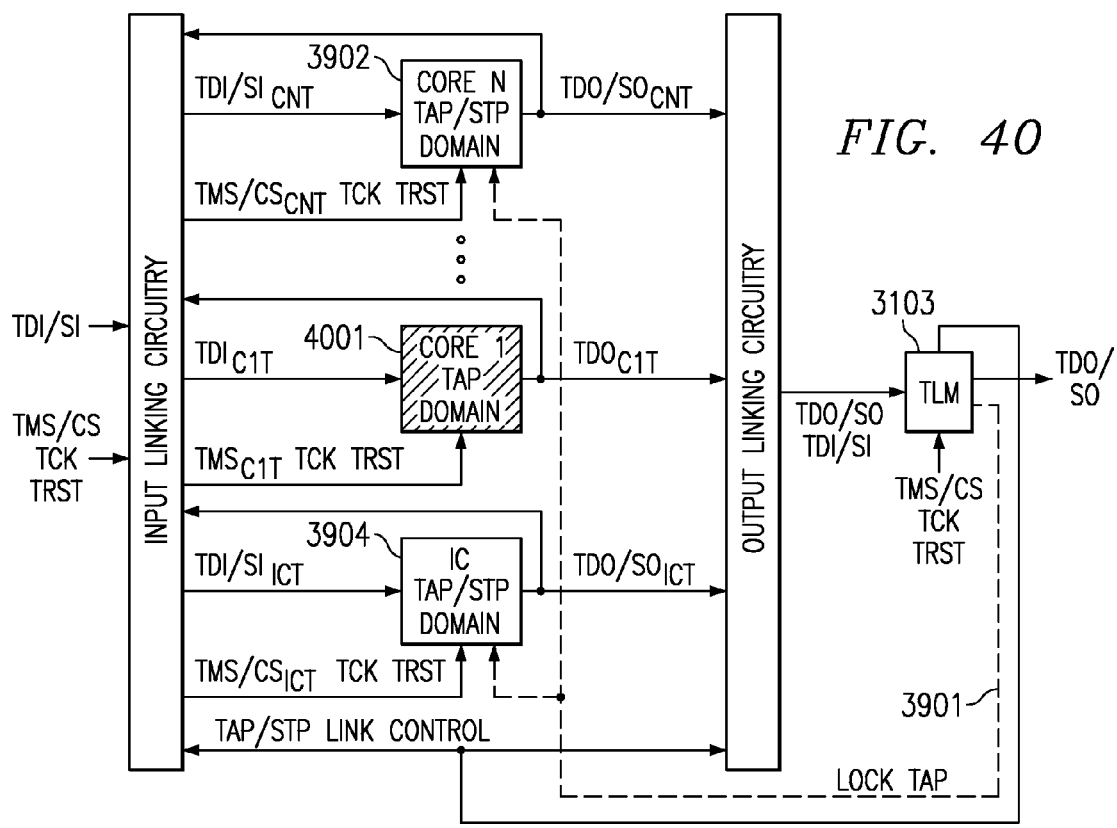
Figure 41:
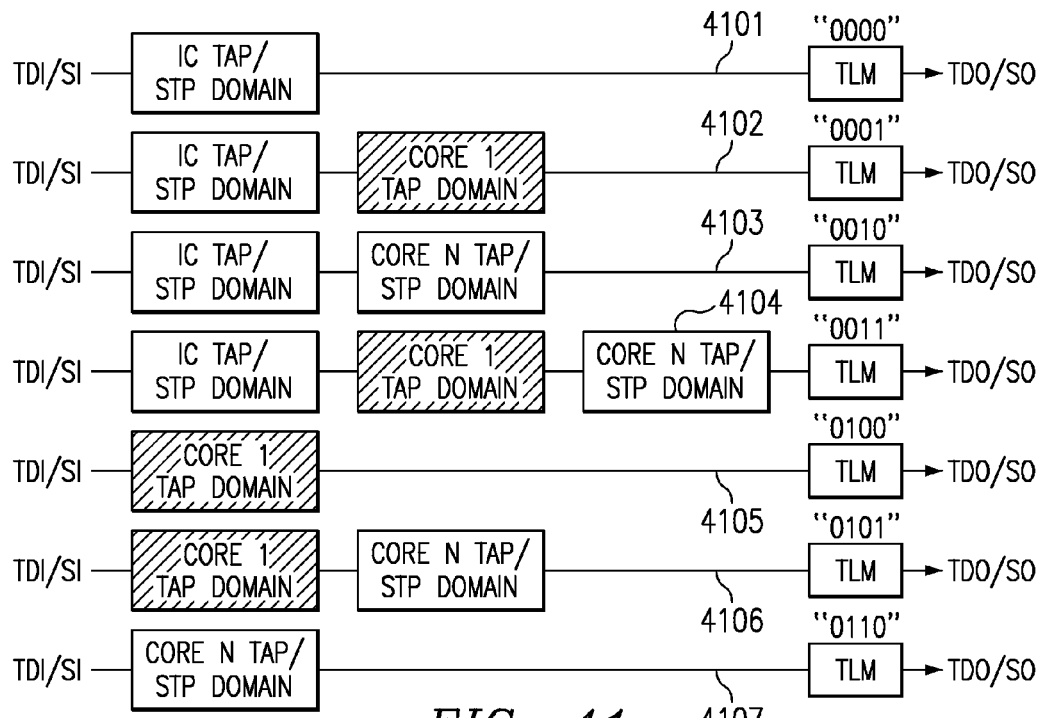
FIGS. 41-43 illustrate various arrangements of domain connections using the architecture of FIG. 40.
Figure 42:
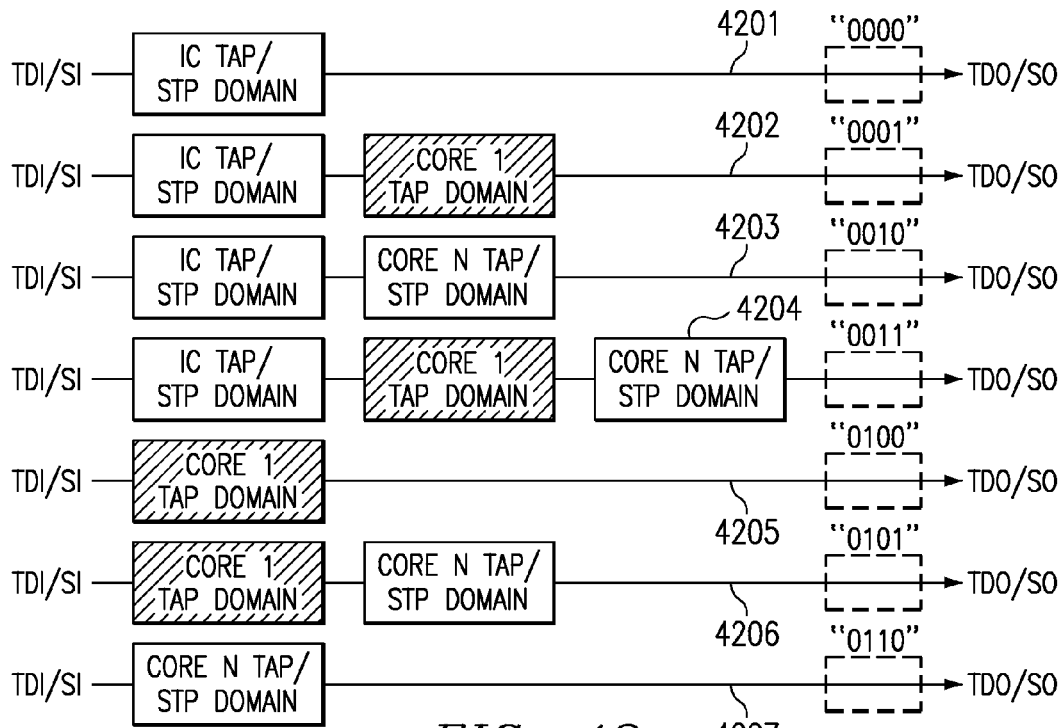
Figure 43:
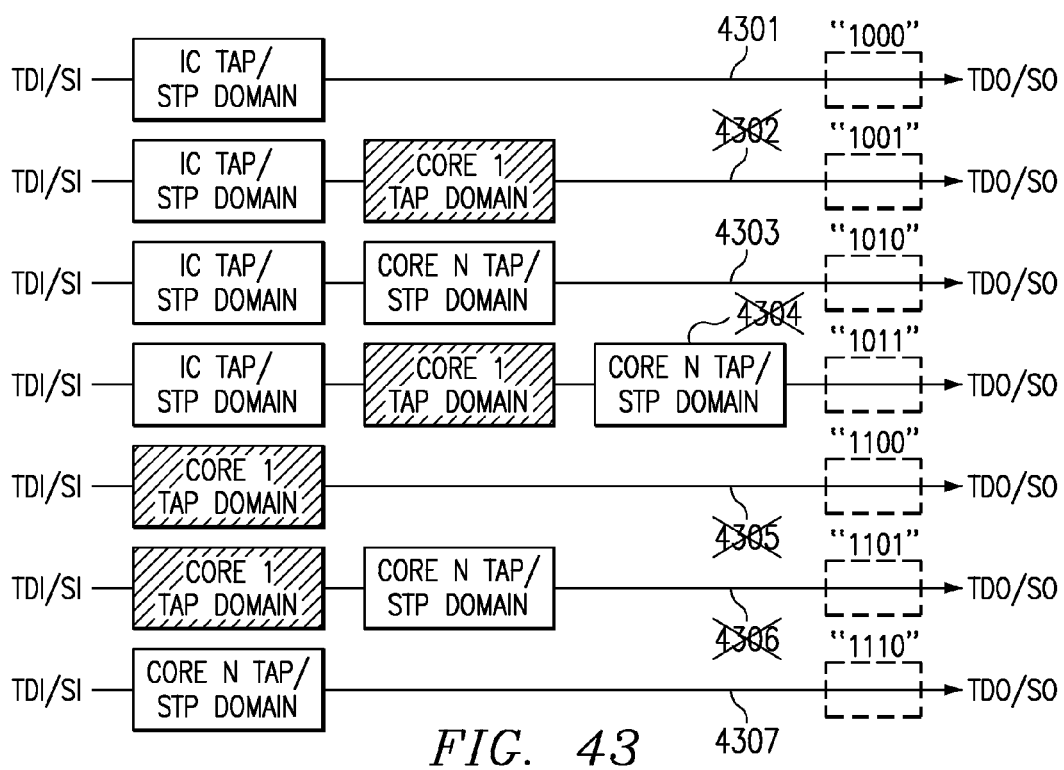

FIG. 40 illustrates another advantage of the TLM architecture. Today, many legacy, or pre-existing, cores exist that use the conventional TAP interface of FIG. 1A. These cores do not comprehend or anticipate use of STP control as an alternate method of using the TAP interface to access embedded functions such as boundary scan, internal scan, in-circuit emulation/debug, or in-circuit programming. In FIG. 40, an IC TAP/STP domain, Core 1 TAP domain, and Core N TAP/STP domain are shown within the TLM architecture of FIG. 31. The IC TAP/STP, Core 1 TAP, and Core N TAP/STP domains are all accessible during TAP controlled operations. For example, in FIG. 41 all combinations of TAP/STP and TAP domains arrangements 4101-4107 are shown being accessible between TDI/SI and TDO/SO during TAP controlled instruction scan operations, as previously described in regard to FIGS. 29 and 36. Also in FIG. 42, all combinations of TAP/STP and TAP domain arrangements 4201-4207 are shown being accessible between TDI/SI and TDO/SO during TAP controlled data scan operations, as previously described in regard to FIGS. 30 and 37. However, in FIG. 43 it is seen that only the TAP/STP domains arrangements 4301, 4303, and 4307 can be connected between TDI/SI and TDO/SO and accessed using STP control. Connecting the Core 1 TAP domain into the STP controlled arrangements of 4302, 4304, 4305, and 4306 would not work since the TAP interface of Core 1 would not be able to shift, update, and capture with the STP control applied on TMS/CS. For example, if the TAP interface of Core 1 were included in arrangements 4302, 4304, 4305, and/or 4306, it would attempt to interpret the STP's shift, update, and capture control on TMS/CS to transition through the TAP controller state diagram of FIG. 2. This would clearly corrupt and disable the STP controlled shift, update, and capture operations to the TAP/STP interface (s) within the 4302, 4304, 4305, and/or 4306 arrangements. Thus the TLM architecture of FIG. 31 advantageously serves to selectively partition conventional legacy TAP interfaces from TAP/STP interfaces during STP controlled access.

It should be understood that while FIGS. 9, 11, 15, 17, 18, 21, 23, 24, 31, 39, and 40 and accompanying descriptions have depicted the present disclosure as it would be applied and used to select core TAP/STP domains within an IC, the present disclosure can also be similarly applied and used to select sub-circuit TAP/STP domains within individual cores as well. For example, FIG. 9 could depict sub-circuits 1-N in a core, each sub-circuit having a TAP/STP interface connected to a core level scan path 910. FIG. 31 could depict sub-circuits in a core, each sub-circuit having a TAP/STP interface connected to input and output circuitry 3101, 3102 and TLM circuit 3103 in the core. FIG. 40 could depict sub-circuits in a core, some sub-circuits having TAP/STP interfaces and some having TAP interfaces and all connected to input and output circuitry 3101, 3102 and TLM circuit 3103 in the core.

Furthermore, it should again be understood that while FIGS. 9, 11, 15, 17, 18, 21, 23, 24, 31, 39, and 40 and accompanying descriptions have depicted the present disclosure as it would be applied and used to select core TAP/STP domains within an IC, the present disclosure can also be similarly applied and used to select IC TAP/STP domains on a multi-chip module, a board, or a higher level circuit block, such as a system backplane. For example, FIG. 9 could depict ICs 1-N on a board, each IC having a TAP/STP interface connected to a board level scan path 910. FIG. 31 could depict ICs on a board, each IC having a TAP/STP interface connected to input and output circuitry 3101, 3102 and TLM circuit 3103 on the board. FIG. 40 could depict ICs on a board, some ICs having TAP/STP interfaces and some having TAP interfaces and all connected to input and output circuitry 3101, 3102 and TLM circuit 3103 on the board.

Additionally, while the present disclosure has shown the use of a dual mode test access port wherein the first mode is TAP controlled and the second mode is STP controlled, the dual mode port concept is general and can be applied to other type of first and second mode controls as well. For example, a dual mode test access port may be implemented wherein the TAP control is used for the first mode and a control different from the STP control is used for the second mode. This alternate second mode control was implied earlier in regard to the alternate STP "back to back" capture control operation description of FIG. 8B.

What is claimed is:

1. An integrated circuit comprising:
   A. a substrate carrying a serial data input lead, a serial data output lead, a select lead, and a clock lead;
   B. functional circuitry on the substrate having data input leads and data output leads;
   C. test access port circuitry on the substrate having:
      i. a test data input lead connected to the serial data input lead,
      ii. a test data output lead connected to the serial data output lead,
      iii. a TAP controller having a test mode select input lead selectively coupled to the select lead, a test clock input lead connected to the clock lead, data register control leads, instruction register control leads, a multiplexer select output lead, and a buffer enable output lead,
      iv. a data register having a data input connected to the test data input lead and having a data output
      v. an instruction register having a data input connected to the test data input a data output and scan circuitry control output leads,
      vi. a multiplexer having a first input connected to the data output of the data register, a second input connected to the data output of the instruction register, a control input connected with the multiplexer select output lead, and a data output, and
      vii. an output data buffer having an input coupled to the data output of the multiplexer, a control input connected with the buffer enable output lead, and an output connected to the test data output lead;
   D. scan test port circuitry on the substrate having:
      i. a scan input lead connected to the serial data input lead,
      ii. a scan output lead selectively coupled to the serial data output lead,
      iii. a capture select input lead,
      iv. a scan clock input lead, and v. a scan register connected between the scan input lead and the scan output lead, the scan register having functional data output and input leads connected to the functional circuitry data input leads and data output leads;

E. connection circuitry on the substrate coupling the scan test port circuitry to the test access port circuitry, the connection circuitry having control inputs connected to the scan circuitry control output leads, the select lead, and the clock lead, and the connection circuitry having control outputs connected to the capture select input lead, and the scan clock input lead; and F. a lead connected between the scan output lead and the first input of the multiplexer.

2. The integrated circuit of claim 1 including a logic gate having one input connected to the select lead, another input connected to a lock out signal, and an output connected to the test mode select lead.

3. The integrated circuit of claim 2 including tap lock circuitry having a lock out signal output connected to the lock out signal input of the logic gate, the tap lock circuitry having inputs connected to the test access port circuitry, the select lead, and the clock lead.

4. The integrated circuit of claim 3 in which the tap lock circuitry has an input connected to an UPDATE-IR signal from the test access port circuitry.

5. The integrated circuit of claim 2 in which the tap lock circuitry includes a state machine having a data input connected to the select lead.

* * * * *